(12) United States Patent
Dillen et al.

(10) Patent No.: US 11,646,174 B2
(45) Date of Patent: May 9, 2023

(54) METHOD FOR CALIBRATING A SCANNING CHARGED PARTICLE MICROSCOPE

(71) Applicant: ASML Netherlands B.V., Veldhoven (NL)

(72) Inventors: Hermanus Adrianus Dillen, Maarheeze (NL); Wim Tjibbo Tel, Helmond (NL); Willem Louis Van Mierlo, Veldhoven (NL)

(73) Assignee: ASML Netherlands, B.V., Veldhoven (NL)

( * ) Notice: Subject to any disclaimer, the term of this patent is extended or adjusted under 35 U.S.C. 154(b) by 607 days.

(21) Appl. No.: 16/730,848

(22) Filed: Dec. 30, 2019

(65) Prior Publication Data

US 2020/0211819 A1 Jul. 2, 2020

Related U.S. Application Data

(60) Provisional application No. 62/943,717, filed on Dec. 4, 2019, provisional application No. 62/787,100, filed on Dec. 31, 2018.

(51) Int. Cl.
*H01J 37/28* (2006.01)
*H01J 37/22* (2006.01)

(52) U.S. Cl.
CPC ............ *H01J 37/28* (2013.01); *H01J 37/222* (2013.01); *H01J 2237/2826* (2013.01)

(58) Field of Classification Search
CPC .. H01J 37/00; H01J 37/02; H01J 37/26; H01J 37/28; H01J 37/21; H01J 37/22;

(Continued)

(56) References Cited

U.S. PATENT DOCUMENTS

| 7,355,709 B1 | 4/2008 | Bevis et al. |
| 2005/0195398 A1* | 9/2005 | Adel ...................... B82Y 10/00 356/401 |

(Continued)

FOREIGN PATENT DOCUMENTS

| JP | 2008 083069 A | 4/2008 |
| TW | 201419377 A | 5/2014 |

OTHER PUBLICATIONS

Tortonese et al., NIST-Traceable Calibration of CD-SEM Magnification Using a 100 nm Pitch Sound; Metrology, Inspection, and Process Control for Microlithography XVII Proceedings of SPIE vol. 5038; 2003; (8 pgs.).

(Continued)

*Primary Examiner* — Jason L McCormack
(74) *Attorney, Agent, or Firm* — Finnegan, Henderson, Farabow, Garrett & Dunner, LLP

(57) ABSTRACT

A method for calibrating a scanning charged particle microscope, such as a scanning electron microscope (SEM), is provided. The method includes dividing a wafer into a plurality of regions; preparing, on each of the plurality of regions, a pattern including a first periodic structure interleaved with a second periodic structure, the first and second periodic structures having an induced offset; determining an actual pitch the first and second periodic structures and thereby determining actual induced offset on each of the plurality of regions; selecting a plurality of regions from among the plurality of regions; measuring, by the SEM, a pitch of first and second periodic structures on each of the plurality of regions; and performing linearity calibration on the SEM based on the determining and the measuring.

11 Claims, 20 Drawing Sheets

(58) Field of Classification Search
CPC ............. H01J 37/222; H01J 2237/2826; H01J 2237/1536; H01J 2237/24578; H01L 22/12
USPC ...................................... 250/252.1, 306, 311
See application file for complete search history.

(56) References Cited

U.S. PATENT DOCUMENTS

| | | | |
|---|---|---|---|
| 2008/0198467 A1* | 8/2008 | Nakayama ............. | G01B 15/00 250/311 |
| 2014/0065736 A1* | 3/2014 | Amir ................... | G03F 7/70683 257/797 |
| 2016/0203945 A1 | 7/2016 | Foucher et al. | |
| 2016/0284609 A1* | 9/2016 | Park ....................... | G01B 21/08 |
| 2017/0256465 A1* | 9/2017 | Van Leest ........... | G03F 7/70633 |

OTHER PUBLICATIONS

Taiwanese Office Action issued by the Intellectual Property Office (IPO) in related Application No. 108148024, dated Oct. 29, 2020 (13 pgs.).
International Search Report issued by the International Searching Authority in related International Application No. PCT/EP2019/085710 (2 pgs.).

* cited by examiner

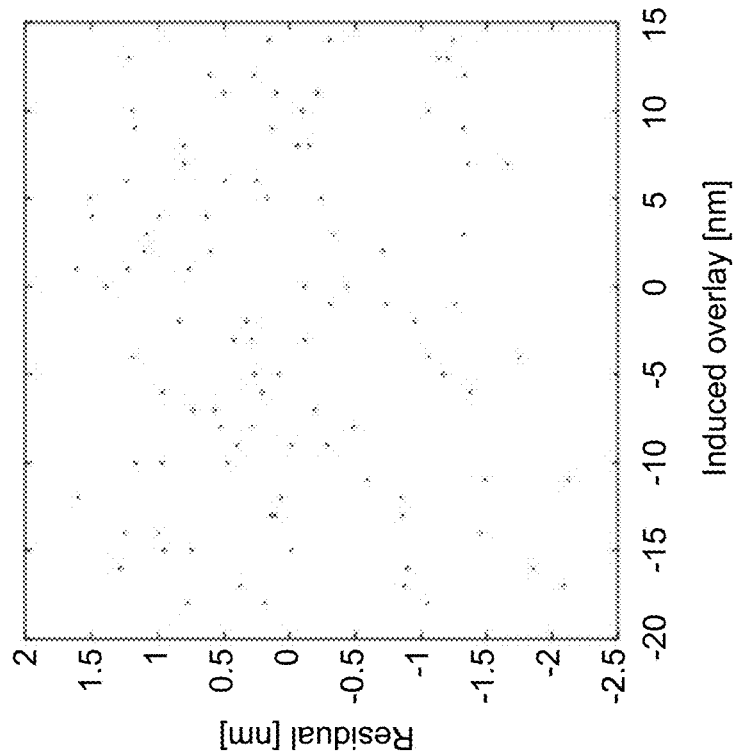
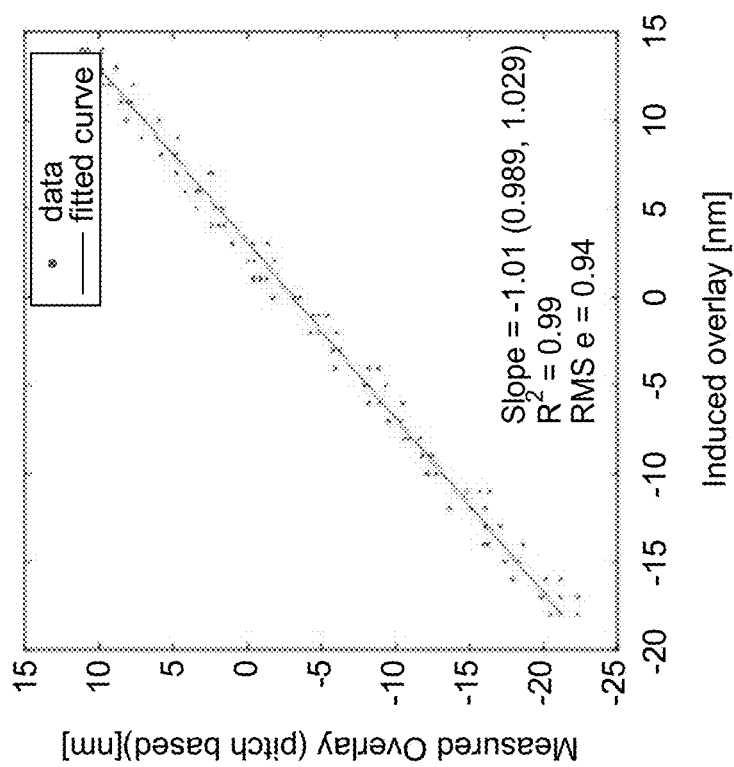
FIG. 12A
FIG. 12B

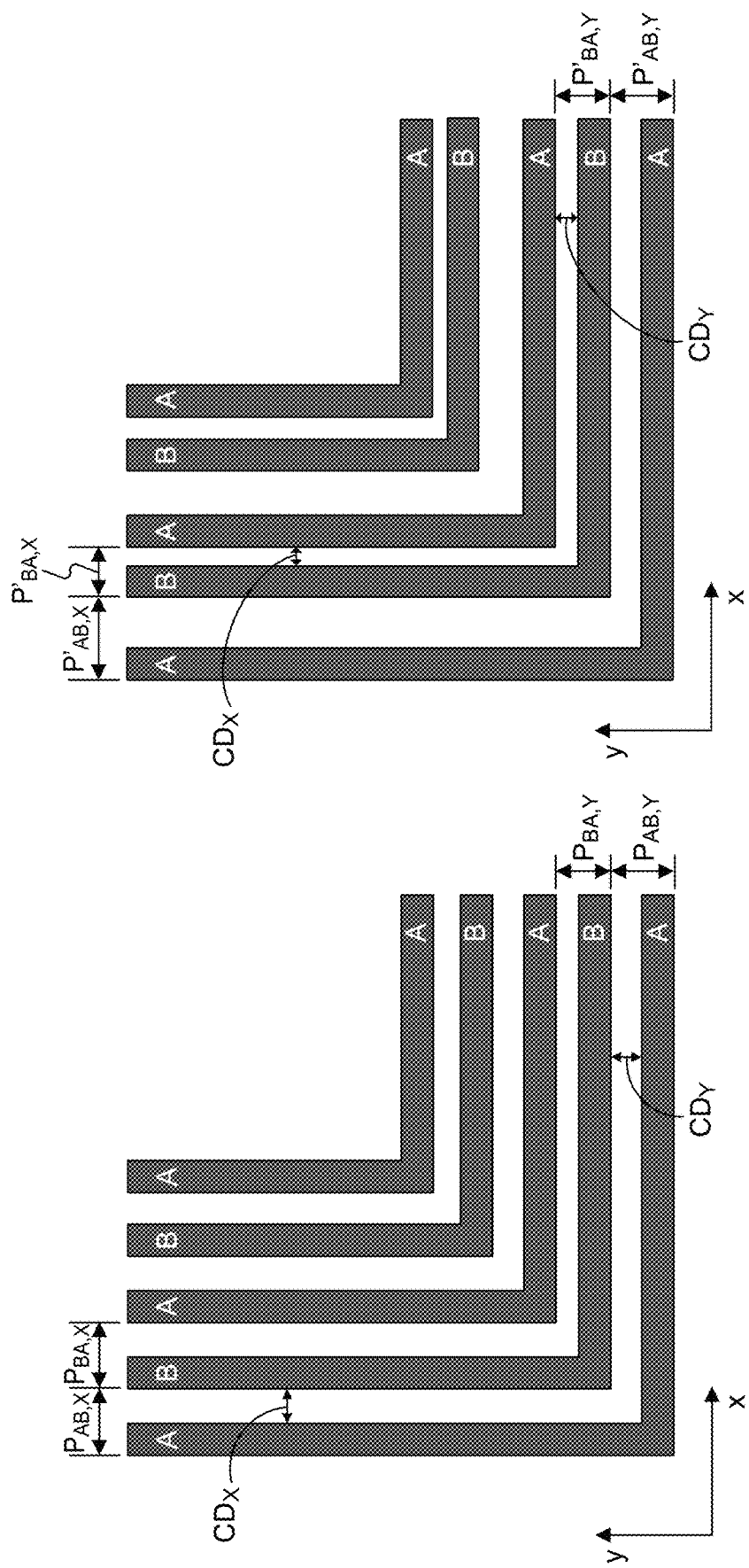

METHOD FOR CALIBRATING A SCANNING CHARGED PARTICLE MICROSCOPE

CROSS-REFERENCE TO RELATED APPLICATIONS

This application claims priority of U.S. application 62/787,100 which was filed on Dec. 31, 2018, and U.S. application 62/943,717 which was filed on Dec. 4, 2019, both of which are incorporated herein by reference in their entireties.

FIELD

Apparatuses and methods consistent with the present disclosure relate generally to calibration techniques, and more particularly, to methods and systems for calibrating a charged particle beam inspection system.

BACKGROUND

In manufacturing processes of integrated circuits (ICs), unfinished or finished circuit components are inspected to ensure that they are manufactured according to design and are free of defects. Inspection systems utilizing optical microscopes or charged particle (e.g., electron) beam microscopes, such as a scanning electron microscope (SEM) can be employed. For accurate measurements, especially for nanometer scaled circuit elements such as transistors, the settings of the SEM need to be calibrated from time to time.

When calibrating the SEM, a reference sample using a single pitch-based standard can be used. In such situations, the reference sample can have a pattern of periodic lines with an equal separation between adjacent lines. In standard calibrating procedures, pitches between adjacent lines of the same pattern can be measured by the SEM. But these standard calibrating procedures have flaws and need to be improved upon.

SUMMARY

According to some embodiments of the present disclosure, there is provided a method for calibrating a scanning electron microscope (SEM). The method comprises: providing a reference sample including a first periodic structure interleaved with a second periodic structure, each of the first periodic structure and second periodic structure having a period along a measurement direction; measuring, by the SEM, an offset between the first periodic structure and the second periodic structure; comparing the measured offset with an induced offset; and calibrating the SEM based on the comparison. The induced offset may comprise an offset deliberately introduced to the reference sample. The induced offset may further comprise an offset caused by an overlay error during a manufacturing process of the reference sample. The induced offset may be traceable to a laser interferometer. The offset measured by the SEM is based on an image of the reference sample obtained by the SEM, and a left edge and a right edge of the first and second periodic structures on the image are asymmetrical. The first periodic structure and the second periodic structure may be on different layers of a wafer. Each of the first periodic structure and the second periodic structure comprises a set of periodic lines.

The method may further comprise: tracing a critical dimension of the first and second periodic structures; and measuring, by the SEM, the critical dimension of the first and second periodic structures, wherein calibrating the SEM further comprises calibrating the SEM based on a correlation between the measured critical dimension and the traced critical dimension of the first and second periodic structures.

The method may further comprise: tracing a line width of the first periodic structure or the second periodic structure; and measuring, by the SEM, the line width of the first periodic structure or the second periodic structure, wherein calibrating the SEM further comprises calibrating the SEM based on a correlation between the measured line width and the traced line width of the first periodic structure or the second periodic structure.

In the method, the first periodic structure includes a first set of lines extending in a first direction and a second set of lines that are connected with the first set of lines and extending in a second direction; and the second periodic structure includes a third set of lines extending in a first direction and a fourth set of lines that are connected with the third set of lines and extending in a second direction.

In the method, the first periodic structure may further comprise a plurality of first periodic sub-structures disposed on different areas of the reference sample, the second periodic structure may further comprise a plurality of second periodic sub-structures disposed on different areas of the reference sample, and each of the plurality of first periodic sub-structures is paired with a corresponding one of the plurality of second periodic sub-structures to form a plurality of pairs of first and second periodic sub-structures.

According to some embodiments of the present disclosure, there is provided a method for calibrating a scanning electron microscope (SEM). The method may comprise: selecting a plurality of regions on a wafer; preparing, on each of the plurality of regions, a pattern including a first periodic structure interleaved with a second periodic structure, the first and second periodic structures having an induced offset; tracing pitches of the first and second periodic structures and the induced offset on each of the plurality of regions; measuring, by the SEM, the pitches of the first and second periodic structures on each of the plurality of regions; and performing a linearity calibration on the SEM based on the tracing and the measuring. In the method, tracing the pitches of the first and second periodic structures may further comprise: tracing, by a laser interferometer, the pitches of the first and second periodic structures and the induced offset on each of the plurality of regions. In the method, performing the linearity calibration on the SEM may further comprise: plotting the measured pitches as a function of the traced induced offsets in x-y coordinates. The method may further comprise: applying a linear fitting to the plotting; obtaining a slope of the linear fitting; comparing the slope with 1 or −1; and performing a calibration based on a deviation of the slope from 1 or −1. The method may further comprise: determining at least one of a coefficient of determination ($R^2$ or the fraction of observed variance explained by the model/fitting), a root mean square deviation, or a range of residual values of the linear fitting. In the method, the induced offsets of the plurality of regions may be different from each other. In the method, the plurality of regions on the wafer may be selected based on random numbers generated by a random number generator. In the method, each of the first and second periodic structures may further comprise a plurality of sub-structures periodically extending in 2 dimensions, and performing the linearity calibration on the SEM may further comprise performing linearly calibration based on data obtained in a first direction and data obtained in a second direction, the second direction is substantially perpendicular to the first direction.

According to some embodiments of the present disclosure, there is provided a method for calibrating a scanning electron microscope (SEM). The method may comprise: preparing, on each of a plurality of regions of a wafer, a pattern including a first periodic structure interleaved with a second periodic structure, the first and second periodic structures having an induced offset; tracing pitches of the first and second periodic structures and the induced offset on each of the plurality of regions; selecting a plurality of regions from the plurality of regions; measuring, by the SEM, pitches of first and second periodic structures on the selected regions; and performing linearity calibration on the SEM. In the method, tracing the pitches of the first and second periodic structures may further comprise: tracing, by a laser interferometer, the pitches of the first and second periodic structures thereby tracing the induced offset on each of the plurality of regions. In the method, performing the linearity calibration on the SEM may further comprise: plotting the measured pitches as a function of the traced induced offsets in x-y coordinate. The method may further comprise: applying a linear fitting to the plotting; obtaining a slope of the linear fitting; comparing the slope with 1 or −1; and performing a calibration based on a deviation of the slope from 1 or −1. The method may further comprise: determining at least one of a coefficient of determination, a root mean square deviation, or a range of residual values of the liner fitting.

According to some embodiments of the present disclosure, there is provided a system for calibrating a scanning electron microscope (SEM). The system may comprise: a reference sample including a first periodic structure interleaved with a second periodic structure, the first and second periodic structures having an induced offset; a laser interferometer having circuitry configured to trace pitches and the induced offset between the first and second periodic structures; the scanning electron microscope is configured to measure the pitches between the first and second set of periodic structures; and a controller having circuitry configured to compare the measured pitches with the traced pitches to perform the calibration.

In the system, the first and second periodic structures comprise a plurality of first periodic structures, each of the regions have a pair of a first periodic structure and a second periodic structure.

In the system, the first and second periodic structures further comprise a plurality of second periodic structures, each of the regions have a pair of a first periodic structure and a second periodic structure.

In the system, the controller may be further configured to: plot the measured pitches as a function of the traced induced offsets in x-y coordinate apply a linear fitting to the plotted data; obtain a slope of the linear fitting; compare the slope with 1 or −1; and calibrate the SEM based on a deviation of the slope from 1 or −1.

According to some embodiments of the present disclosure, there is provided a reference sample for calibration. The reference sample may comprise: a first periodic structure having a period along a measurement direction; and a second periodic structure that has the period along the measurement direction and offsets from the first periodic structure, wherein the offset between the first periodic structure and the second periodic structure is an induced offset deliberately introduced to the reference sample.

BRIEF DESCRIPTION OF FIGURES

FIG. 12A is a graph showing another example of linearity calibration of a SEM and FIG. 12B is a graph showing residual values of the linearity calibration in FIG. 12A, consistent with some embodiments of the present disclosure.

FIG. 13A is a schematic diagram illustrating a top plan view of a reference sample having 2-dimensional line patterns without overlay error, and FIG. 13B is a schematic diagram illustrating a top plan view of a reference sample having 2-dimensional line patterns with induced overlays, consistent with some embodiments of the present disclosure.

DETAILED DESCRIPTION

Figure 1:
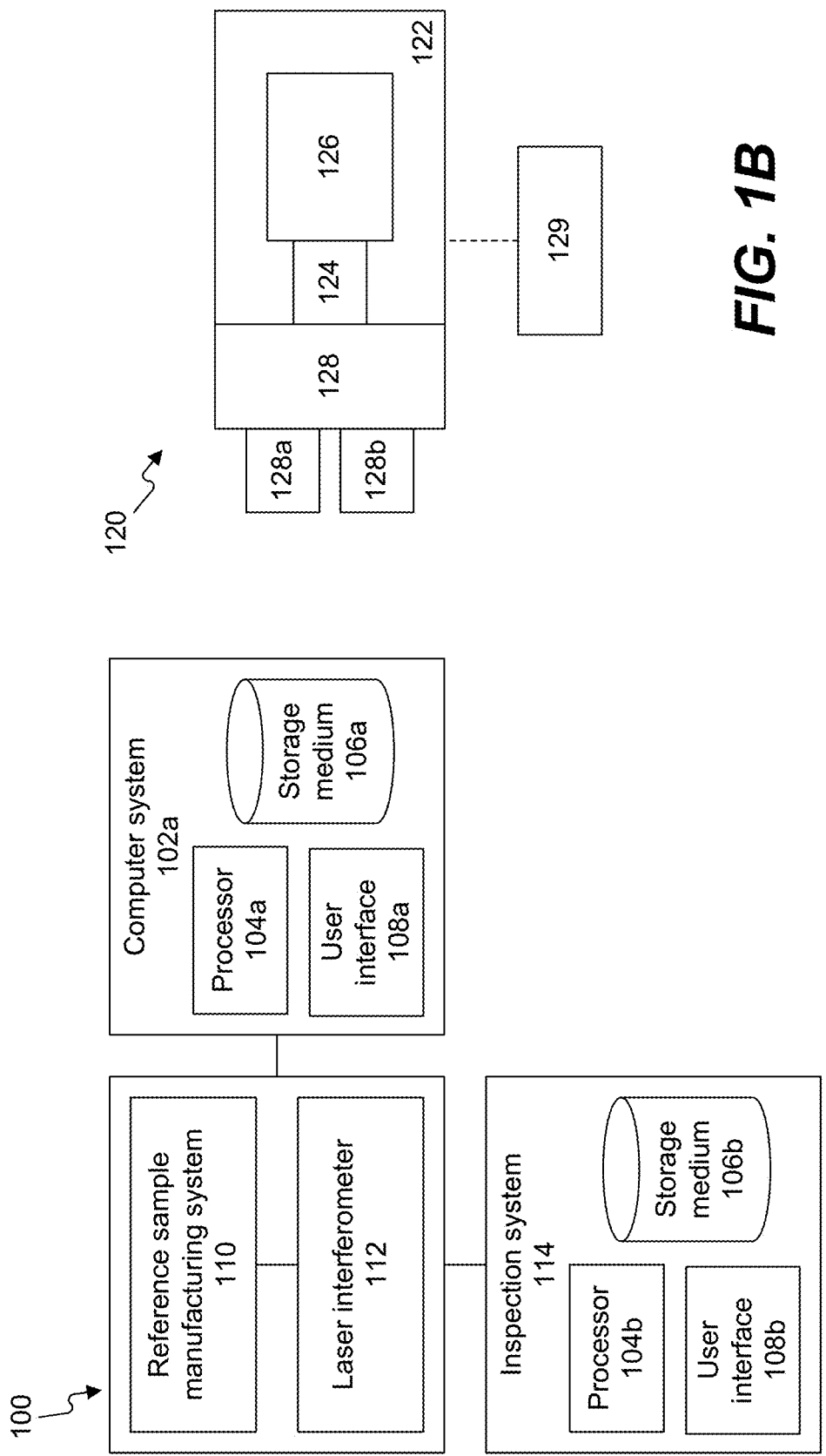
FIG. 1A is a block diagram illustrating an exemplary calibration system, consistent with some embodiments of the present disclosure.
FIG. 1B is a schematic diagram illustrating an exemplary electron beam inspection (EBI) system, consistent with some embodiments of the present disclosure.

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims. For example, although some embodiments are described in the context of utilizing scanning electron microscope (SEM) for generation of a wafer image and defect detection, the disclosure is not so limited. Other types of microscopes such as atomic force microscope (AFM) and scanning probe microscope (SPM) can be similarly applied.

The enhanced computing power of electronic devices, while reducing the physical size of the devices, can be accomplished by significantly increasing the packing density of circuit components such as, transistors, capacitors, diodes, etc. on an IC chip. For example, in a smart phone, an IC chip (which is the size of a thumbnail) may include over 2 billion transistors, the size of each transistor being less than $\frac{1}{1000}^{th}$ of a human hair. Not surprisingly, semiconductor IC manufacturing is a complex process, with hundreds of individual steps. Errors in even one step have the potential to dramatically affect the functioning of the final product. Even one "killer defect" can cause device failure. The goal of the manufacturing process is to improve the overall yield of the process. For example, for a 50-step process to get 75% yield, each individual step must have a yield greater than 99.4%, and if the individual step yield is 95%, the overall process yield drops to 7%.

In various steps of the semiconductor manufacturing process, pattern defects can appear on at least one of a wafer, a chip, or a mask and can cause a manufactured semiconductor device to fail, thereby reducing the yield to a great degree. As semiconductor device sizes continually become smaller and smaller (along with any defects), identifying defects becomes more challenging and costly. Currently, engineers in semiconductor manufacturing lines usually spend hours (and even sometimes days) to identify locations of small detects to minimize their impact on the final product.

Conventional optical inspection techniques are ineffective in inspecting small defects (e.g., nanometer scale defects). Advanced electron-beam inspection (EBI) tools, such as a scanning electron microscope (SEM) with high resolution and large depth-of-focus, have been developed to meet the need in the semiconductor industry. One function performed by a SEM is measurement of critical dimensions (CDs), such as the measurement of the distance between structures, the measurement of a dimension of a structure, etc. (e.g., in FIG. 4A, the separation distance between two adjacent lines, the width of a line, etc.). When manufacturing a chip with billions of transistors and interconnect wires, being able to precisely control the size of and space between structures, such as interconnect wires, transistor gates, contacts, vias, etc., is very important for achieving the target yield, as poorly controlled CDs lead to manufacturing defects, such as a short between adjacent wires, an open on a wire, etc.

When scanning a structure(s) and measuring certain features of the structure(s), an issue occurs due to effects that cause asymmetries to occur in the characterization of the structure(s). A SEM works by sending a beam of electrons towards a sample, where the electrons interact with the sample and cause electrons (e.g., secondary electrons, backscatter electrons, etc.) to be emitted from the sample. A detector detects these electrons, and measures the current waveform resulting from the detected electrons. For example, in FIG. 4B, the beam may scan the structure shown by the lower figure from left to right, and the detector measures the resulting current waveform shown by the upper figure.

While the structure being scanned is symmetric, as the left and right edges of the structure are mirror images of each other, the current waveform is not symmetric, with the portion of the waveform corresponding to the left edge of the structure being quite different from a mirror image of the portion of the waveform corresponding to the right edge of the structure. In this example, this asymmetry is not the result of any asymmetry in the structure being imaged by the SEM, but rather is due to other effects. For example, when scanning from left to right, the beam first encounters the left edge of the structure. Charge from the electron beam begins to charge the left edge of the structure as the beam moves across the structure from left to right. This charging of the left side of the structure creates an electric field, which affects electrons of the electron beam as the beam traverses to the right side of the structure, and which resultantly causes a change in the electrons emitted as the SEM scans the right side of the structure. Effects such as these cause the waveform measured by the detector to be asymmetric, even though the structure being scanned is symmetric.

When trying to measure the width of the structure (i.e., the distance from the left edge of the structure to the right edge of the structure), this asymmetry in the waveforms introduces error into the measurement. This asymmetry also introduces error in the measurement of a distance between two structures, as this is a measurement from, e.g., a right edge of a first structure to a left edge of a second structure. Interestingly, when measuring a distance between a left edge of a first structure and a left edge of a second structure, or a right edge of a first structure and a right edge of a second structure, since symmetric edges are being measured (e.g., from a left edge to a left edge, from a right edge to a right edge), the edge waveforms are similar and do not exhibit the above discussed waveform asymmetry. It is when the SEM measures asymmetric edges (e.g., from a left edge to a right edge, from a right edge to a left edge) that the above discussed waveform asymmetry occurs.

If one is trying to measure a CD that involves an asymmetric measurement (i.e. from left edge to right edge or from right edge to left edge), measurement accuracy would be improved if the error introduced in the CD measurement due to the above discussed asymmetric waveform could be characterized and used to adjust the measured CD to obtain a more accurate measurement, one that accounts for the error introduced due to the asymmetric waveform.

Some of the disclosed embodiments enable errors that results from the above discussed asymmetric waveforms to be characterized, which further enables a more accurate CD measurement, as the measured CD can be adjusted to account for the error introduced due to the asymmetric waveform. The process of determining this error and adjusting measurements to enable more accurate measurements can happen during a calibration phase of the SEM.

Calibration of a SEM may be performed using a reference sample having a periodic line pattern having a designed pitch. The periodic line pattern can be formed by selectively etching a material on a substrate, and the formed pitch is determined by a symmetrical measurement technique and is considered as a "standard" pitch for calibration. During calibration, the reference sample is placed in the SEM; a pitch value of the reference sample is measured using the SEM; and the measured pitch is compared with the standard pitch to perform calibration.

But using the standard pitch for calibration is quite limited. That is, the standard pitch standard uses only a single set of lines with no variation in pitch or only uses a very limited number of pitches available. Moreover, the pitch measurement uses a symmetrical measurement (e.g. from left edge of a first line to the left edge of a second line adjacent to the first line), while the SEM response to left and right edges on a line in an image is likely to produce an asymmetrical waveform (e.g., in FIG. 4B, compare the symmetrical geometry of the bottom figure with the asymmetrical waveform of the top figure), which can be due to non-ideal conditions (sample charging, slight differences in local geometry). This can lead to problems as lines become smaller as the left and right edges start to influence each other (e.g., the waveform of the top figure of FIG. 4C) and it becomes more difficult to accurately determine the weaker edge position (i.e. the right edge of the waveform with intensity much lower than the left edge in FIG. 4C). Furthermore, when applying the conventional pitch measurement, many or all errors that are not directly related to the SEM image itself are cancelled out, leaving only magnification error. The net result of the conventional pitch measurement is that there is no traceable linearity calibration of the actual measured CD, which determines the left and right edges of a line.

The embodiments of the present disclosure utilize a CD linearity calibration by utilizing a double patterning process in combination with an induced critical dimension (induced CD) to create two sets of lines with different CD values. The difference between a CD-calibration and pitch calibration is that in the pitch calibration the same edge is always measured (either the left or right edge, there is no symmetry difference between edges, i.e. symmetric measurement), whereas in CD calibrations, both left and right edges are measured (i.e., asymmetric measurement). The variations introduced in the double patterning using the CD linearity is more flexible and can utilize more data points in order to better calibrate the SEM. The double patterning variations can be induced by exposing and etching a first structure with a first mask, and then exposing and etching a second structure with a second mask, where the first and second masks have an overlay (resulting in an offset between a corresponding pair of first and second structures) that is characterized by a laser interferometer, resulting in the overlay being accurately known. For example, a SEM may measure distances between asymmetric edges of a plurality of corresponding pair of first and second structures that are patterned on a wafer. Each pair of first and second structures may have a different offset and each offset may be characterized by an interferometer.

The disclosed embodiments provide a method of calibrating a SEM using a reference sample having periodic patterns with an induced critical dimension (induced CD) that is deliberately introduced between the patterns. For example, the induced critical dimension can involve using two patterns, each having different line widths, or can involve an offset overlay (hereinafter "induced overlay"). The stage laser interferometer measures the position of the wafer stage (which is relative to the reference sample that is used for calibration) with very high accuracy (using mirrors on the wafer stage and laser interferometers). This can be used to offset (induce overlay) two patterns with high accuracy. The stage laser interferometer is provided for dynamically determining a position of stage holding a sample and automatically compensating position errors. The stage laser interferometer can comprise a plurality of interferometer units configured to generate signals based on a position of a stage. The stage laser interferometer further includes a computing device, which can be configured to determine the position of the sample based on the signals, and in response to the determined position, provide instructions associated with the determined position by a control module for controlling a motor of a stage, or for controlling a motor to adjust interferometer units emitting charged particle beams, or combinations thereof, to compensate position errors of a sample automatically.

Moreover, the disclosed embodiments provide a method of a linear calibration of a SEM by forming a plurality of patterns having induced overlays in a plurality of regions across a reference sample and tracing the induced overlays of the plurality of patterns. Moreover, measured pitch/CD/overlay values of the plurality of patterns are obtained. Using the measured values and the traced induced overlays, a linear fitting of a plot can be obtained. For thin lines such as those shown in FIG. 4C, a 1:1 relation may no longer exist between the differences in actual CD and the differences in measured CD due to the asymmetric nature of a CD measurement. By randomizing the layout of the plurality of patterns across the entire wafer, it is able to convert a systemic wafer fingerprint to noise (i.e. no correlation between measured parameter and signal caused by processing artifacts).

As used herein, unless specifically stated otherwise, the term "or" encompasses all possible combinations, except where infeasible. For example, if it is stated that a database may include A or B, then, unless specifically stated otherwise or infeasible, the database may include A, or B, or A and B. As a second example, if it is stated that a database may include A, B, or C, then, unless specifically stated otherwise or infeasible, the database may include A, or B, or C, or A and B, or A and C, or B and C, or A and B and C.

Reference is now made to FIG. 1A, a block diagram illustrating an exemplary calibration system, consistent with some embodiments of the present disclosure. As shown in FIG. 1A, a calibration system 100 comprises a first computer system 102a, an inspection system 114, a laser interferometer 112, and a reference sample manufacturing system 110. Computer system 102a further comprises a processor 104a, a storage medium 106a, and a user interface 108a. Processor 104a can comprise multiple processors. Computer system 102a is in communication with reference sample manufacturing system 110 via wired or wireless communications.

Computer system 102a may include, but is not limited to, a personal computer, a workstation, a network computer, or any device having one or more processors. Storage medium 106a stores calibration instructions and processor 104a is configured (via its circuitry) to execute the calibration instructions to control the calibration process. Processor 104a is configured to build a plurality of calibration knowledge files based on previous calibration results.

User interface 108a includes a display configured to display a calibration reference sample image and an input device configured to transmit user commands to computer system 102a. The display displays measurement results such as topography image and length measurement by using scientific instrument such as SEM and one or more interferometers, in some embodiments. The display may be any type of a computer output surface and projecting mechanism that shows text and graphic images, including (but not limited to) cathode ray tube (CRT), liquid crystal display (LCD), light-emitting diode (LED), gas plasma, a touch screen, or other image projection technologies, for displaying information to a computer user. The input device may be any type of a computer hardware equipment used to provide data and control signals from an operator to computer system 102a. The input device may include, but is not limited to, a keyboard, a mouse, a scanner, a digital camera, a joystick, a trackball, cursor direction keys, a touchscreen monitor, or audio/video commanders, etc., for communicating direction information and command selections to processor or for controlling cursor movement on display.

In some embodiments, reference sample manufacturing system 110 includes a UV or EUV photolithographic system and an etching apparatus to produce a reference sample. Laser interferometer 112 controls the accurate positioning of the lithography system's wafer stage for inducing accurate overlay between both litho-etch steps. Laser interferometer 112 is controlled by computer system 102a. A user can operate laser interferometer 112 through inputting parameters for the measurement. Also, computer system 102a obtains the data determined by laser interferometer 112 and stores the data in storage medium 106a. In some embodiments, user interface 108a may display the manufacturing or measurement parameters on a display. After the measurement, the reference sample is transferred to inspection system 114.

In inspection system 114, the reference sample is placed on a SEM vacuum chamber. The SEM measures a pitch or a critical dimension of the reference sample, and thereby further obtains measured overlay. The user can operate inspection system 114 through inputting parameters for the measurement through user interface 108b. Also, user interface 108b displays the measurement result in the display, in some embodiments. After the measurement, the SEM measured values of CD, pitch, and overlay of the pattern in the reference sample are outputted to processor 104b and stored in storage medium 106b. Processor 104b further processes the data obtained from SEM and transmits calibration signal to the SEM.

Reference is now made to FIG. 1B, a schematic diagram illustrating an exemplary electron beam inspection system included in the inspection system 114, consistent with some embodiments of the present disclosure. As shown in FIG. 1B, electron beam inspection system 120 includes a main chamber 122, a load/lock chamber 124, an electron beam tool 126, and an equipment front end module 128. Electron beam tool 126 is located within main chamber 122. Equipment front end module 128 includes a first loading port 128a and a second loading port 128b. Equipment front end module 128 may include additional loading port(s). First loading port 128a and second loading port 128b receive wafer cassettes that contain wafers (e.g., semiconductor wafers or wafers made of other material(s)) or samples to be inspected (wafers and samples are collectively referred to as "wafers" hereafter).

One or more robot arms (not shown) in equipment front end module 128 transport the wafers to load/lock chamber 124. Load/lock chamber 124 is connected to a load/lock vacuum pump system (not shown) which removes gas molecules in load/lock chamber 124 to reach a first pressure below the atmospheric pressure. After reaching the first pressure, one or more robot arms (not shown) transport the wafer from load/lock chamber 124 to main chamber 122. Main chamber 122 is connected to a main chamber vacuum pump system (not shown) which removes gas molecules in main chamber 122 to reach a second pressure below the first pressure. After reaching the second pressure, the wafer is subject to inspection by electron beam tool 126.

A controller 129 is electronically connected to electron beam inspection system 120. Controller 129 may be a computer configured to execute various controls of electron beam inspection system 120. While controller 109 is shown in FIG. 1B as being outside of the structure that includes main chamber 122, load/lock chamber 124, and equipment front end module 128, it is appreciated that controller 109 can part of the structure.

Figure 2:
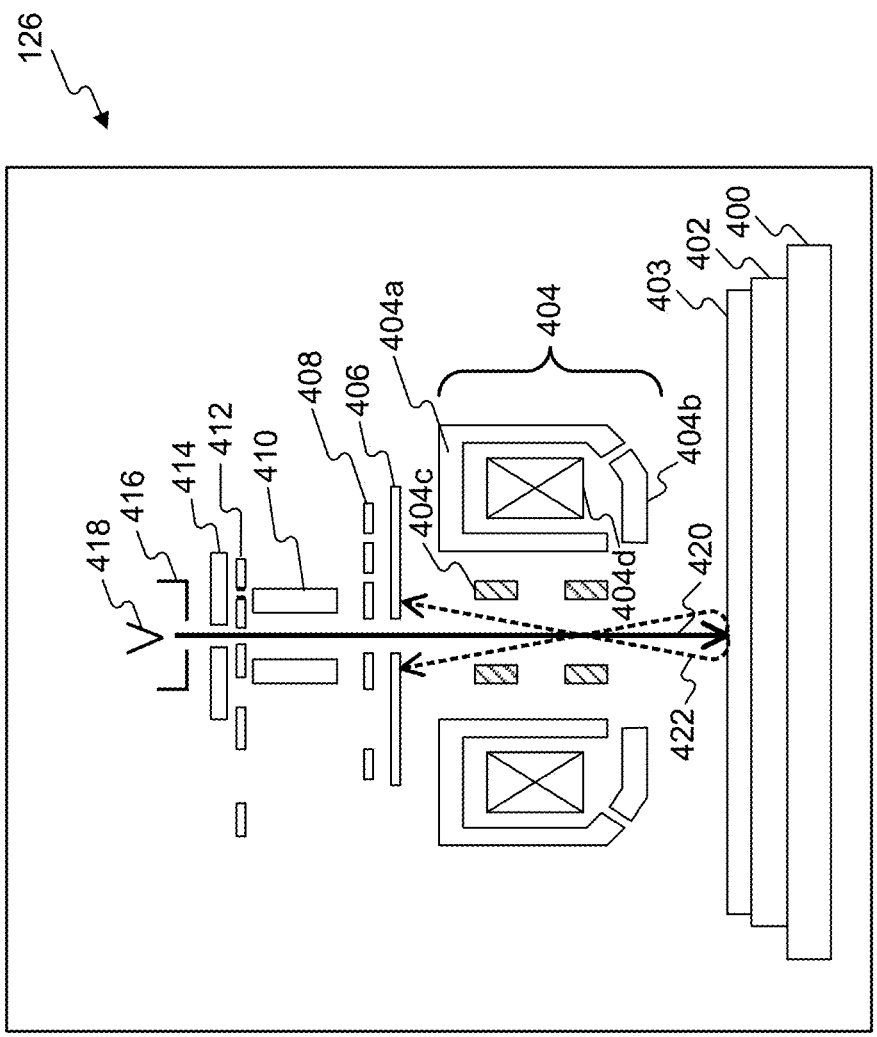
FIG. 2 is a schematic diagram illustrating an exemplary electron beam tool that can be a part of the exemplary electron beam inspection (EBI) system of FIG. 1B, consistent with some embodiments of the present disclosure.

References are now made to FIG. 2, a schematic diagram illustrating an exemplary electron beam tool that can be a part of the exemplary electron beam tool 126 of FIG. 1B, consistent with some embodiments of the present disclosure. As shown in FIG. 2, electron beam tool 126 includes a motorized stage 400, and a wafer holder 402 supported by motorized stage 400 to hold a wafer 403 to be inspected. Electron beam tool 126 further includes an objective lens assembly 404, electron detector 406 (which includes electron sensor surfaces), an objective aperture 408, a condenser lens 410, a beam limit aperture 412, a gun aperture 414, an anode 416, and a cathode 418. Objective lens assembly 404, in some embodiments, can include a modified swing objective retarding immersion lens (SORIL), which includes a pole piece 404a, a control electrode 404b, a deflector 404c, and an exciting coil 404d. Electron beam tool 126 may additionally include an energy dispersive X-ray spectrometer (EDS) detector (not shown) to characterize the materials on the wafer.

A primary electron beam 420 is emitted from cathode 418 by applying a voltage between anode 416 and cathode 418. Primary electron beam 420 passes through gun aperture 414 and beam limit aperture 412, both of which can determine the size of electron beam entering condenser lens 410, which resides below beam limit aperture 412. Condenser lens 410 focuses primary electron beam 420 before the beam enters objective aperture 408 to set the size of the electron beam before entering objective lens assembly 404. Deflector 404c deflects primary electron beam 420 to facilitate beam scanning on the wafer. For example, in a scanning process, deflector 404c can be controlled to deflect primary electron beam 420 sequentially onto different locations of top surface of wafer 403 at different time points, to provide data for image reconstruction for different parts of wafer 403. Moreover, deflector 404c can also be controlled to deflect primary electron beam 420 onto different sides of wafer 403 at a particular location, at different time points, to provide data for stereo image reconstruction of the wafer structure at that location. Further, in some embodiments, anode 416 and cathode 418 may be configured to generate multiple primary electron beams 420, and electron beam tool 126 may include a plurality of deflectors 404c to project the multiple primary electron beams 420 to different parts/sides of the wafer at the same time, to provide data for image reconstruction for different parts of wafer 203.

Exciting coil 404d and pole piece 404a generate a magnetic field that begins at one end of pole piece 404a and terminates at the other end of pole piece 404a. A part of wafer 403 being scanned by primary electron beam 420 can be immersed in the magnetic field and can be electrically charged, which, in turn, creates an electric field. The electric field reduces the energy of impinging primary electron beam 420 near the surface of the wafer before it collides with the wafer. Control electrode 404b, being electrically isolated from pole piece 404a, controls an electric field on the wafer to prevent micro-arching of the wafer and to ensure proper beam focus.

A secondary electron beam 422 can be emitted from the part of wafer 403 upon receiving primary electron beam 420. Secondary electron beam 422 can form a beam spot on a surface of a sensor of electron detector 406. In some embodiments, one or more detectors (e.g., an Everhart-Thornley detector) can be used to capture escaping secondary electrons using an electric field. Electron detector 406 can generate a signal (e.g., a voltage, a current, etc.) that represents an intensity of the beam spot and provide the signal to a processing system (not shown). The intensity of secondary electron beam 422, and the resultant beam spot, can vary according to the external or internal structure of wafer 403. Moreover, as discussed above, primary electron beam 420 can be projected onto different locations of the top surface of the wafer to generate secondary electron beams 422 (and the resultant beam spot) of different intensities. Therefore, by mapping the intensities of the beam spots with the locations of wafer 403, the processing system can reconstruct an image that reflects the internal or external structures of wafer 403. Once a wafer image is acquired by electron beam tool 126, the wafer image may be transmitted to computer system 102 (as shown in FIG. 1A).

Figure 3:
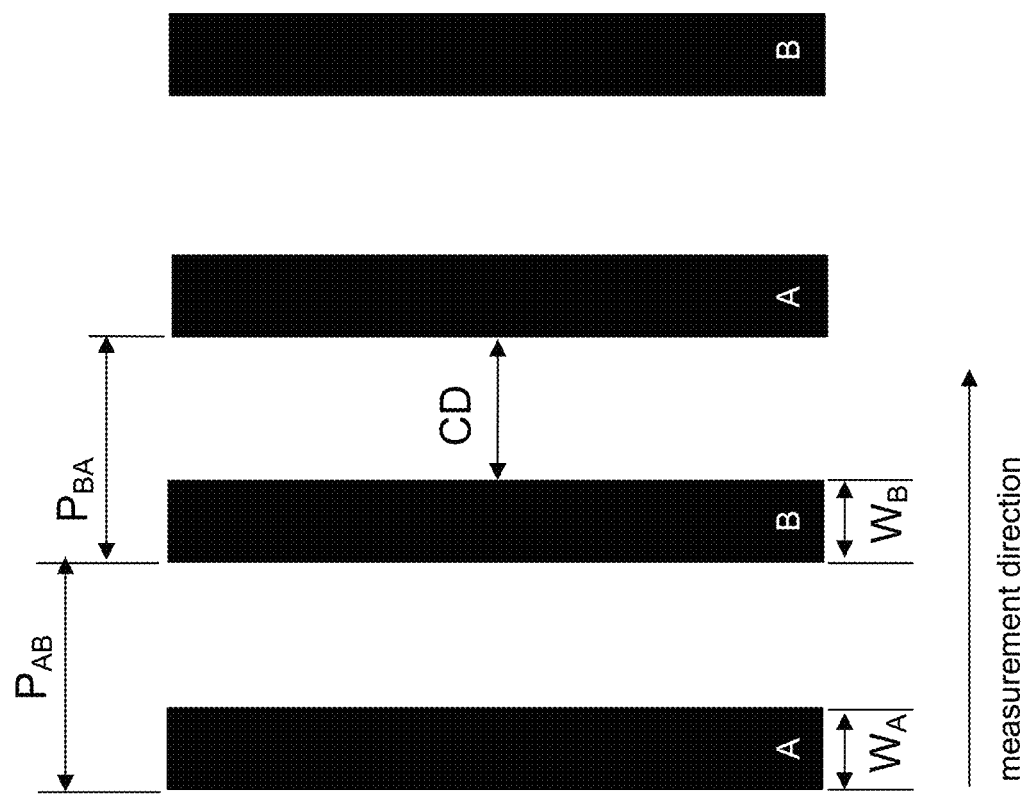
FIG. 3 is a schematic diagram illustrating a top plan view of a reference sample without overlay error of a conventional system.

References are now made to FIG. 3, a schematic diagram illustrating a top plan view of a reference sample without overlay error for a conventional system. In FIG. 3, a periodic line pattern A is interleaved with a periodic line pattern B along a measurement direction. Pattern A and pattern B may be formed using a double-patterning scheme during manufacturing. The double-patterning scheme can involve using two separate lithography and etch steps (one for pattern A and another for pattern B) on a layer. Each of the lines in pattern A has a line width $W_A$ and each of the lines in pattern B has a line width $W_B$ and line width $W_A$ and line width $W_B$ are intended to be the same. During manufacturing, a pitch $P_{AB}$ between a left edge of a line in pattern A and a left edge of a line in pattern B is used. Similarly, a pitch $P_{BA}$ between a left edge of a line in pattern B and a left edge of a subsequent line in pattern A are used. In conventional systems of FIG. 3, pitch $P_{AB}$ and pitch $P_{BA}$ are the same. While a critical dimension (CD) between pattern A and pattern B can also be defined during the manufacturing stage, as stated above, the CD is not used during the calibration process for calibration systems.

In calibrating a SEM, the reference sample is placed inside the chamber of the SEM. The SEM measures the pitches of the reference sample.

But as device sizes continually become smaller and smaller, along with any defects, the pitches of the reference sample reduce to a smaller scale, for example, a few nanometers.

Figure 4A:
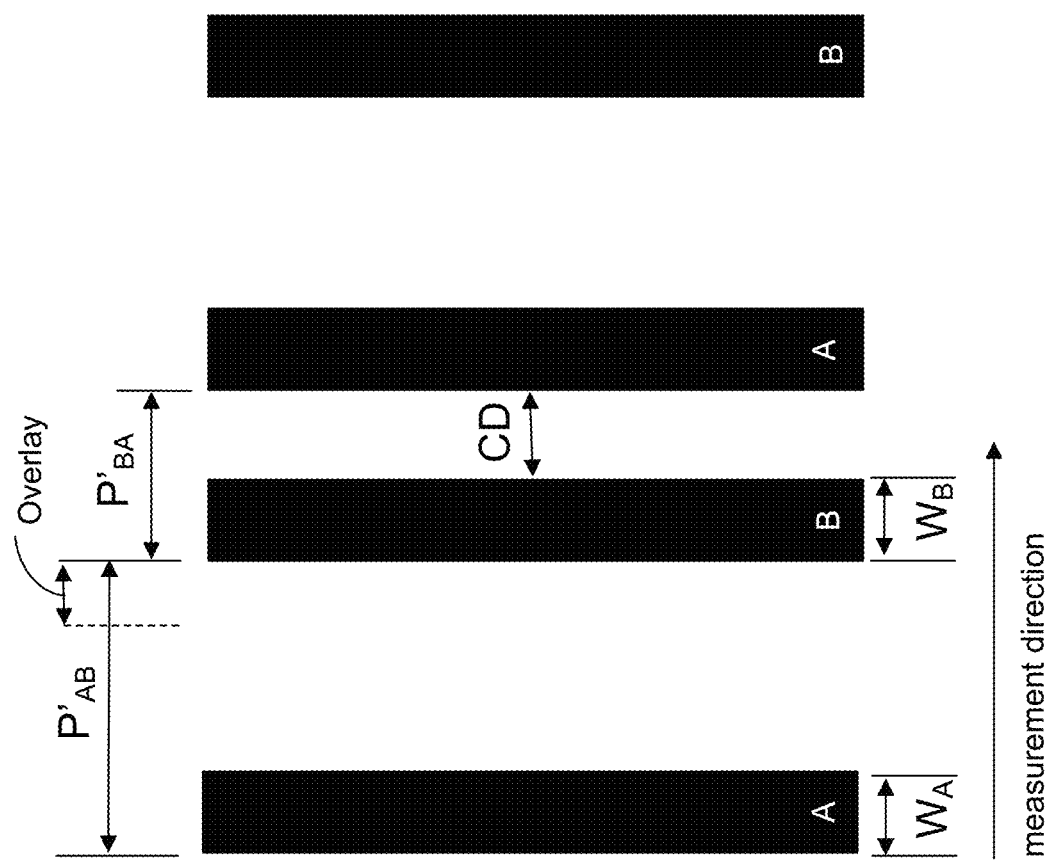
FIG. 4A is a schematic diagram illustrating a top plan view of a reference sample having an induced overlay.

Reference is now made to FIG. 4A, a schematic diagram illustrating a top plan view of a reference sample having an induced overlay, consistent with some embodiments of the present disclosure. The reference sample having the induced overlay can be obtained by a double-patterning method used during the manufacturing of the reference sample. During double-patterning, a first pattern (such as pattern A) can be printed by a photolithography followed by an etching. After printing of the first pattern, a new photolithography and a new etching are performed on top of the first pattern. In printing the second pattern (such as pattern B), the mask is aligned such that there is predetermined offset between the first pattern and the second pattern. As stated above, laser interferometers can be used to assist with ensuring the accuracy of the placement of the patterns. The stage laser interferometer measures the position of the wafer stage (which is relative to the reference sample that is used for calibration) with very high accuracy (using mirrors on the wafer stage and laser interferometers). This can be used to offset (induce overlay) two patterns with high accuracy.

As shown in FIG. 4A, a periodic line pattern A is interleaved with a periodic line pattern B along a measurement direction. Pattern A has a line width $W_A$ and pattern B has a line width $W_B$. Line width $W_A$ may be the same as or different from line width $W_B$. In some embodiments, pattern A and pattern B are not limited to line shapes, they can have any shapes (such as the shapes shown in FIGS. 13A-15B). A pitch $P'_{AB}$ is set from a left edge of a line in pattern A to a left edge of a line in pattern B, the two lines are adjacent. Similarly, a pitch $P'_{BA}$ is set from a left edge of a line in the pattern B to a left edge of a line in pattern A, the two lines are adjacent. An overlay between pattern A and pattern B is obtained by subtracting $P'_{BA}$ from $P'_{AB}$, resulting in a non-zero value in FIG. 4A.

In FIG. 4A, an overall overlay of the reference sample includes the intentionally induced overlay and a processing-caused natural overlay error. The overlay or offset between, for example, pattern A and pattern B (e.g., "Overlay" on FIG. 4A) can be accurately controlled by a laser interferometer as these two patterns are manufactured (e.g., when they are exposed with a photolithography tool). For example, a first die can be exposed with pattern A and pattern B offset by 20 nm (referred to as an "induced offset" or "induced overlay"), a second die can be exposed with an induced offset of 15 nm between pattern A and pattern B, etc., with the offset controlled by the laser interferometer of a photolithography scanner. Further, the distance between adjacent left edges (e.g., $P'_{AB}$) or adjacent right edges can be accurately characterized with a SEM, as the charge build up does not impact the accuracy of same edge measurements. The distance between adjacent left/right or right/left edges can be characterized with a SEM, but this distance will have error caused due to charge build up and an associated induced asymmetry in the image. By varying the offsets between the patterns (e.g., patterns A and B) and obtaining the above described measurements, a trend can be determined that can be used to determine an error introduced in CD measurements (or other metrology-related errors) due to the charge build up and resulting induced image asymmetry. It is noted that an induced overlay can have a corresponding induced CD (e.g., as the induced overlay is varied, the CD varies, and the resulting varied CD can be referred to as being an induced CD).

Figure 4C:
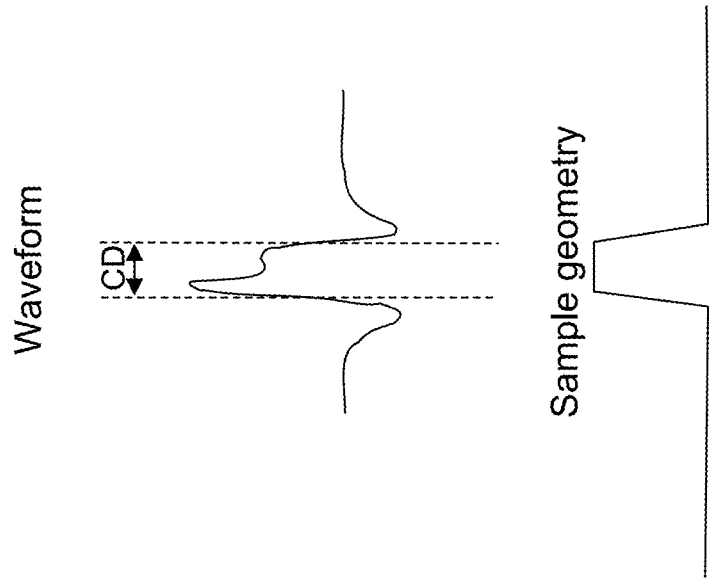
FIG. 4C is a schematic diagram illustrating a cross-sectional view of a reference sample (a very fine line) and waveform of secondary electron signal measured by the SEM, consistent with some embodiments of the present disclosure.
Figure 4B:
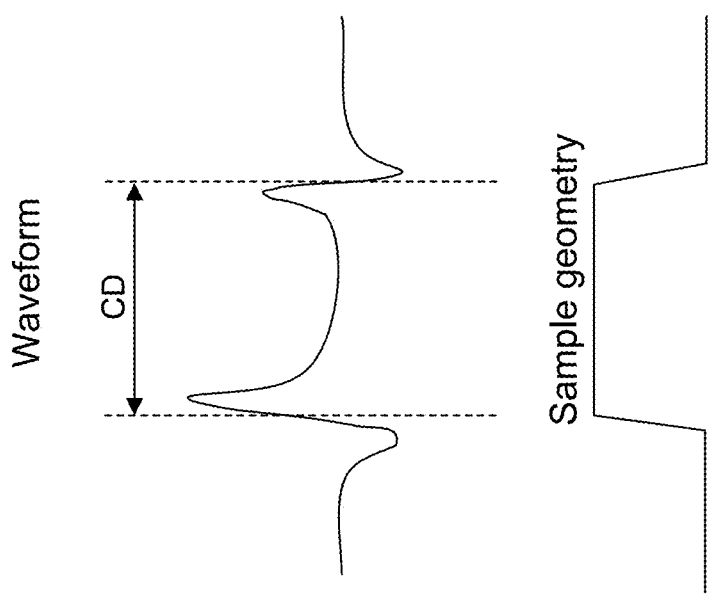
FIG. 4B is a schematic diagram illustrating a cross-sectional view of a reference sample (a line) and waveform of secondary electron signal measured by an SEM.

For example, the waveforms at the top of FIGS. 4B and 4C represent the current detected by a detector that detects electrons emitted from a sample (e.g., secondary electrons, backscattered electrons, etc.). As the e-beam scans from left to right, charge begins to build up on the geometry (see, e.g., the geometry at the bottom of FIGS. 4B and 4C). As the charge builds up, the surface of the geometry becomes more positively charged, resulting in fewer electrons that are emitted from the right side of the geometry being able to escape the geometry due to being attracted back to the geometry by the increased positive charge that builds up on the surface as the e-beam scans left to right. Accordingly, the current detected by the detector when the e-beam is at the right edge of the geometry is less than the current detected when the e-beam is at the left edge of the geometry (even when the edges are physically mirror images of each other), resulting in an error in the measured CD.

However, as previously discussed, by varying the offsets between the patterns (e.g., patterns A and B) and obtaining the above described measurements, a trend can be determined that can be used to determine an error introduced in CD measurements due to the charge build up and resulting induced image asymmetry.

During calibration of a SEM, such as electron beam tool 126 of FIG. 2, the reference sample having the predetermined induced overlay is placed inside the chamber of the SEM. While the SEM measures pitch $P'_{AB}$ and pitch $P'_{BA}$, it can also be used to measure the induced CD, in this case, the spacing between patterns A and B. Unlike the conventional systems that only measure the pitches, the SEM measures both left and right edges (i.e. asymmetric measurement) to determine the induced overlay of the reference sample. The variations introduced in the double patterning using the CD linearity is more flexible and can utilize more data points to better calibrate the SEM. Therefore, the calibration method using the reference sample as shown in FIG. 4A is capable of taking into account the natural overlay error as well as the asymmetry on the edges of the SEM images (e.g., due to asymmetric charge build up as the SEM scans from, for example, left to right, and the resulting impact due to the charge build up on the image, as represented in FIGS. 4B and 4C), leading to more accurate calibration results.

The SEM asymmetric measurement measures the secondary electrons that are emitted from a sample as the e-beam scans across the sample. For a well-spaced or formed line pattern, i.e., where a left edge of a feature is a mirrored version of its adjacent right edge (FIG. 4B), a SEM image may show an asymmetry, such as due to the above discussed asymmetric charge build up, which leads to an image waveform that appears as the waveform at the top of FIG. 4B. The waveforms that appear at the top of FIGS. 4B and 4C represent the current that is received by a detector that detects charged particles emitted from a sample (e.g., secondary electrons, backscattered electron, etc.) that is being scanned by an e-beam.

Figure 4D:
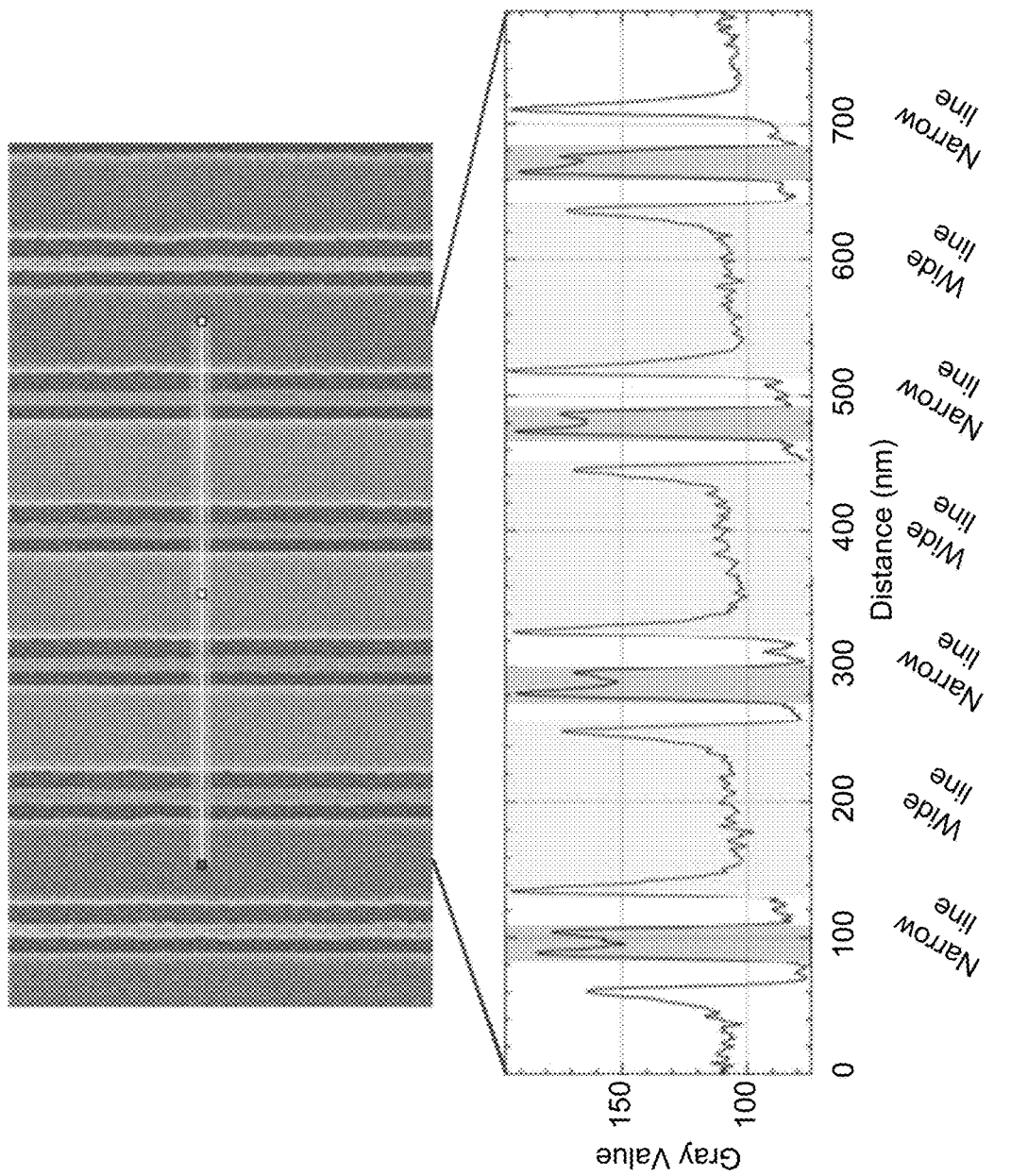
FIG. 4D is an exemplary top plan view of a reference sample using two periodic patterns and corresponding waveforms of a secondary electron signal measured by the SEM, consistent with some embodiments of the present disclosure.

In some embodiments, an induced CD on the reference sample can correspond with a width of the patterns. For example, as shown in FIG. 4D, the lines of one pattern can use thinner widths, while the lines of the other pattern can have thicker widths. While a conventional calibration system has issues with calibrating using thinner lines due to the left edge of the waveform influencing the right edge of the waveform (e.g., as shown in FIG. 4C), the embodiments of the present disclosure use of induced CD allows the SEM system to be more accurately calibrated.

Figure 5:
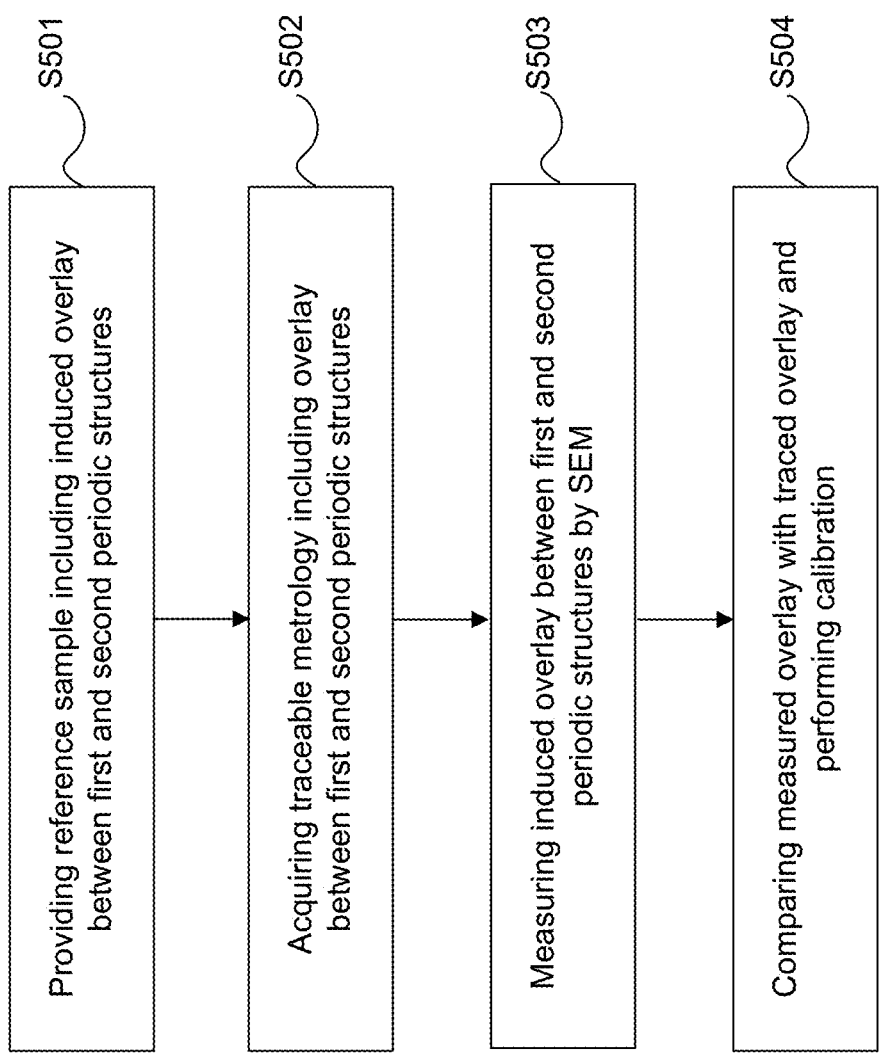
FIG. 5 is a flow chart illustrating an exemplary method of calibrating a SEM, consistent with some embodiments of the present disclosure.

References are now made to FIG. 5, a flow chart illustrating an exemplary method of calibrating a SEM, consistent with some embodiments of the present disclosure. In FIG. 5, the method includes a step S501 of providing a reference sample, such as the reference sample shown in FIG. 4A, including first periodic structure A interleaved with second periodic structure B along the measurement direction. There is an induced CD (e.g., the CD of FIG. 4A that corresponds to the induced overlay of FIG. 4A), between the first and second periodic structures (e.g., periodic structure A and periodic structure B in FIG. 4A). Because of this induced overlay, a bi-pitch method for calibrating the SEM is possible. It is appreciated that while the method is directed to an induced overlay, the method is equally applicable to an induced line width where one pattern uses thinner lines while the other pattern uses thicker lines (e.g., as shown in FIG. 4D).

The method further includes a step S502 of acquiring traceable metrology lined to an interferometer, the metrology including the induced CD (in this case, the induced overlay) between the first periodic structure (e.g., first periodic structure A of FIG. 4A) and the second periodic structure (e.g., second periodic structure B of FIG. 4A). The traceable metrology can be determined by a scanner, such as based on a laser interferometer of the scanner that controls an induced CD or induced overlay. It is appreciated that step S502 can be performed prior to S501 or after S503.

The method further includes a step S503 of measuring the reference sample for an overlay or offset between the first periodic structure (e.g., first periodic structure A of FIG. 4A) and the second periodic structure (e.g., second periodic structure B of FIG. 4A) using the SEM to be calibrated. In particular, the CDs and pitches are measured, and an overlay or offset is further obtained. The measured pitch can be based on a measured distance between asymmetric edges of a feature or features (e.g., from a left edge of a feature to an adjacent right edge of the feature, from a right edge of a first feature to a left edge of an adjacent second feature, etc.). Then, in step S504, the overlay or offset measured by the SEM is compared with the actual overlay or offset value traced by the laser interferometer to perform the calibration. By tracing actual pitches with non-symmetrical, edge sensitive laser interferometer, the calibration takes a natural overlay error as well as asymmetry on edges in an SEM image into account, leading to the enhanced accuracy of the calibration.

Figure 6:
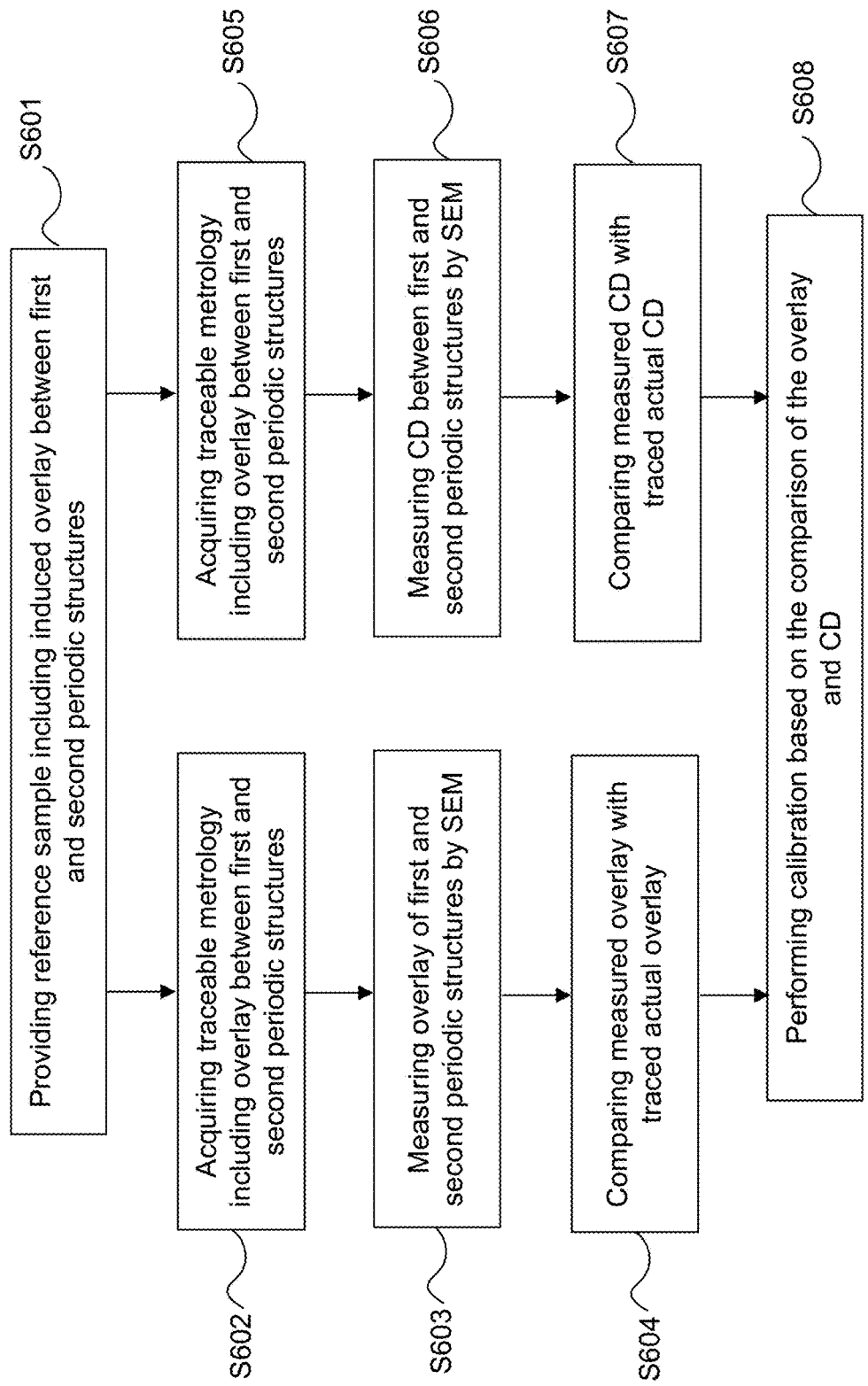
FIG. 6 is a flow chart illustrating another exemplary method of calibrating a SEM, consistent with some embodiments of the present disclosure.

References are now made to FIG. 6, a flow chart illustrating another exemplary method of calibrating a SEM, consistent with some embodiments of the present disclosure. In FIG. 6, the method includes a step S601 of providing a reference sample including a first periodic structure (e.g., first periodic structure A of FIG. 4A) and a second periodic structure (e.g., second periodic structure B of FIG. 4A) having a period along a measurement direction. There is an induced overlay (e.g., Overlay of FIG. 4A) of the second periodic structure with respect to the first periodic structure, in some embodiments.

The method includes steps S602-S604 which are similar to steps S502-S504 of FIG. 5. For brevity, the descriptions of steps S602-S604 are omitted here. Compared with FIG. 5, the method in FIG. 6 further includes a step S605 of acquiring traceable metrology lined to an interferometer of the manufacturing, the metrology including the induced CD. The induced CD can be the line widths of the lines for the patterns (e.g., FIG. 4D) or the space between the first periodic structure (e.g., first periodic structure A of FIG. 4A) and the second periodic structure (e.g., second periodic structure B of FIG. 4A). The method further includes a step S606 of measuring the CD using the SEM. In step S607, the SEM-measured CD is compared with the traced CD. Then, in step S608, the calibration is performed based on the comparisons of the overlay and the CD. It is appreciated that the performance of steps S602-S604 can occur before, during, or after the performance of steps S605-S607. Compared with FIG. 5, the method of FIG. 6 takes more parameters (i.e., the CD) into consideration, further enhancing the accuracy of the calibration.

Figure 7:
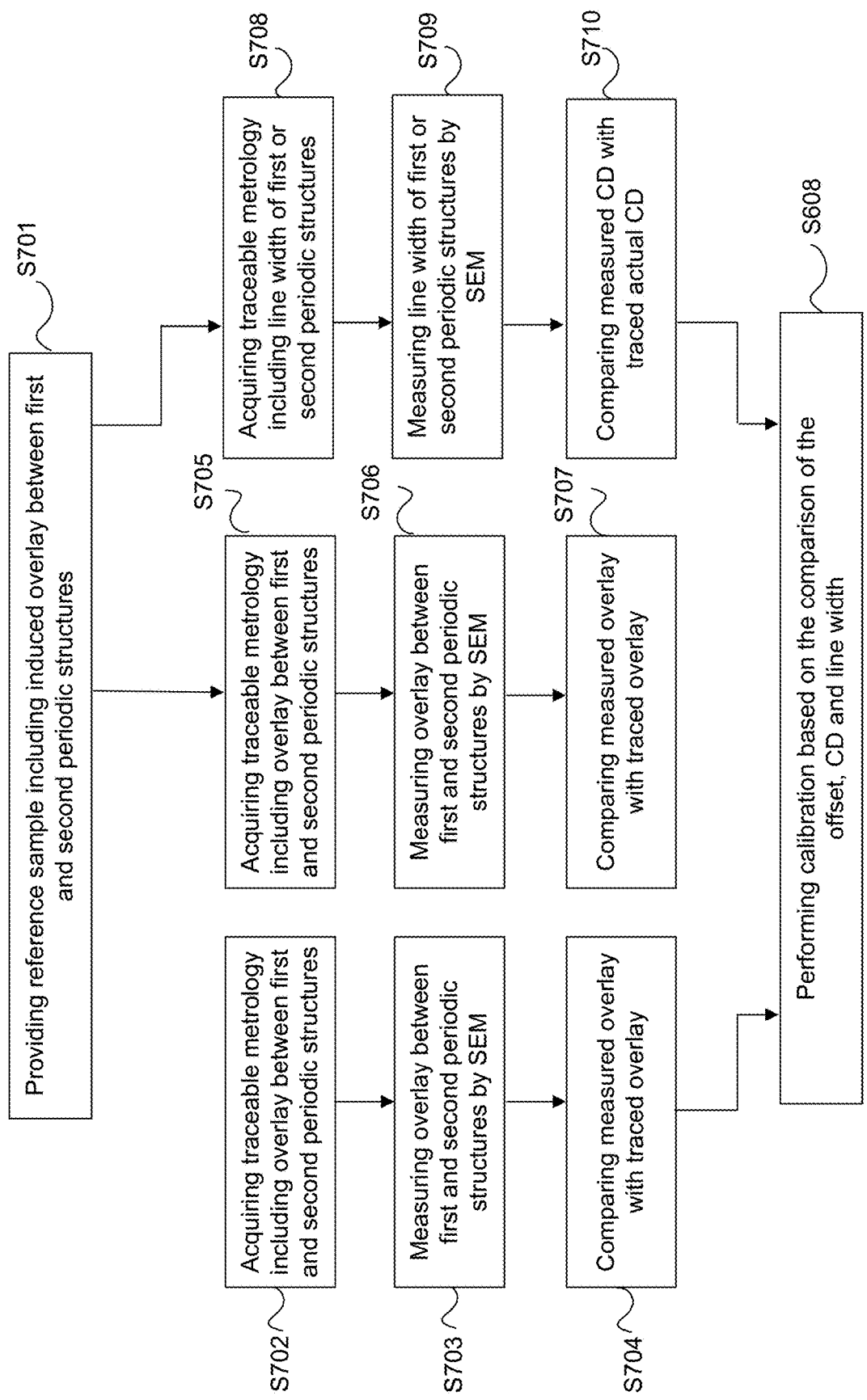
FIG. 7 is a flow chart illustrating another exemplary method of calibrating a SEM, consistent with some embodiments of the present disclosure.

References are now made to FIG. 7, a flow chart illustrating another exemplary method of calibrating a SEM, consistent with some embodiments of the present disclosure. In FIG. 7, the method includes a step S701 of providing reference sample, such as the reference sample of FIG. 4A, including a first periodic structure (e.g., first periodic structure A of FIG. 4A), and a second periodic structure (e.g., second periodic structure B of FIG. 4A). There is an induced overlay (e.g., overlay of FIG. 4A) of the second periodic structure with respect to the first periodic structure.

The method includes steps S702-S704 which are similar to steps S602-S604 of FIG. 6. The method further includes steps S705-S707 which are similar to steps S605-S607 of FIG. 6. For brevity, the descriptions of steps S702-S704 and S705-S707 are omitted here.

Compared with FIG. 6, the method in FIG. 7 further includes a step S708 of acquiring traceable metrology lined to an interferometer, the metrology including the induced CD of the lines of the first periodic structure and of the second periodic structure, that is line width $W_A$ or line width $W_B$ in FIG. 4A. As shown in FIG. 4D, the line width can be varied across the two patterns. The method further includes a step S709 of measuring the line width of the first periodic structure or the second periodic structure using the SEM. Then, in step S710 the measured width is compared with the traced line width. Then, instep S711, the calibration is performed based on the comparison of the overlay, the CD, and the line width in steps S704, S707, and S710. It is appreciated that the performance of steps S702-S704 can occur before, during, or after the performance of steps S705-S707 and S708-S710. Compared with FIG. 6, the method in FIG. 7 considers additional factors (e.g., the line width) during calibration, further enhancing the accuracy of the calibration from various aspects.

Figure 8A:
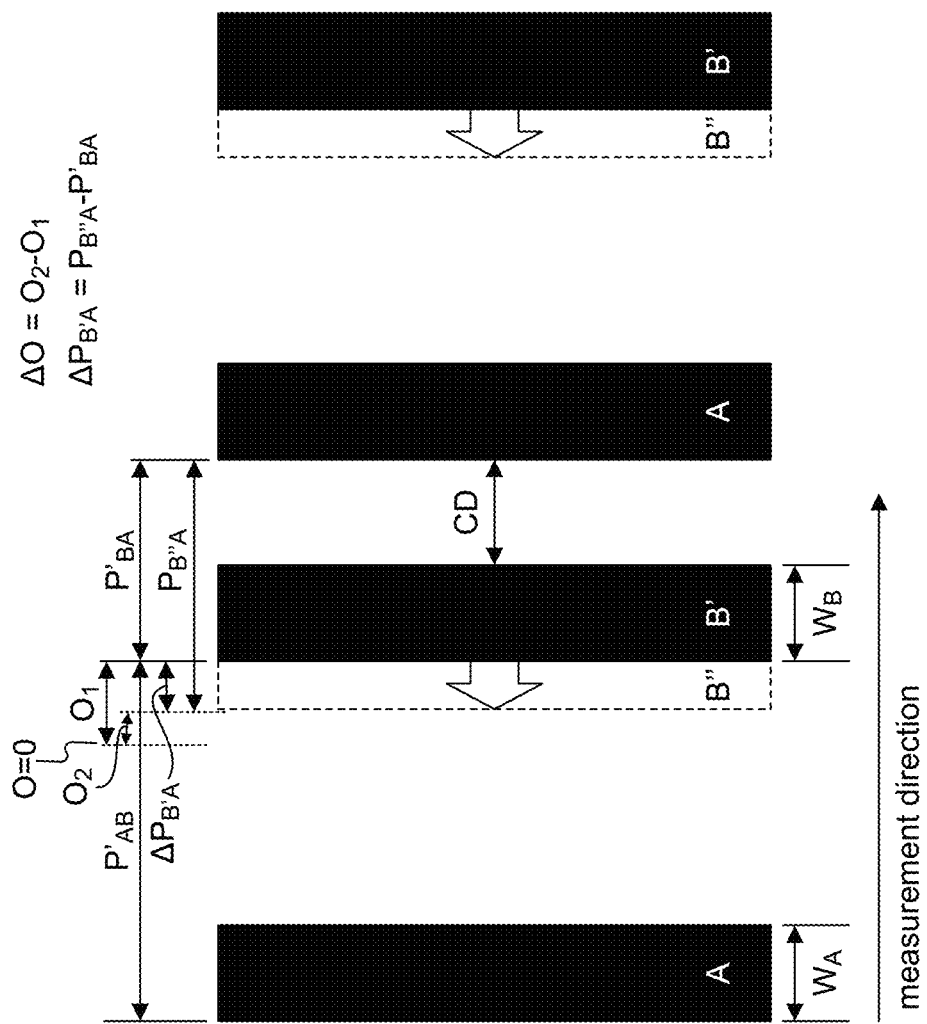
FIG. 8A is a schematic diagram illustrating change of a pitch and change of an induced overlay in a reference sample, and 8B is a graph showing relationship between the change of the pitch and the change of the overlay plotted in x-y coordinate, consistent with some embodiments of the present disclosure.
Figure 8B:
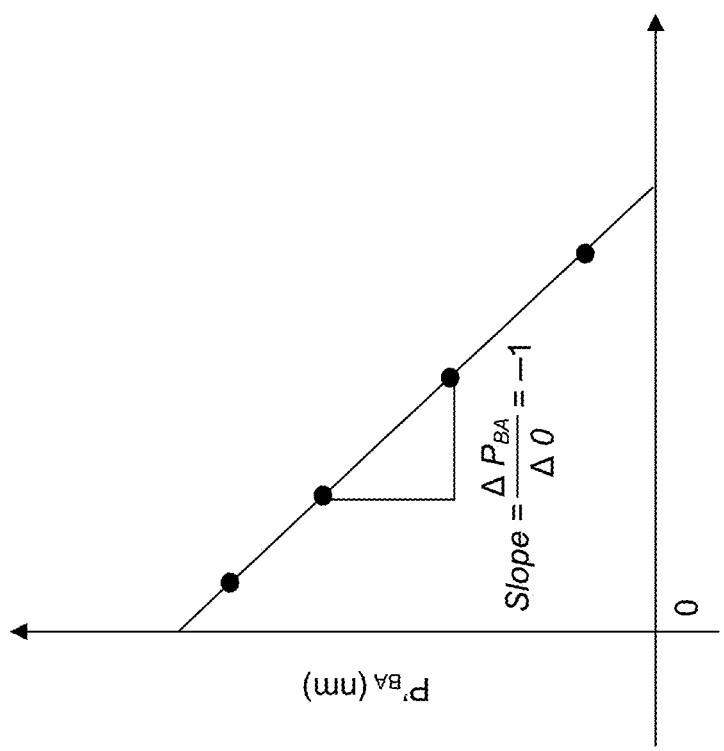

References are now made to FIG. 8A, a schematic diagram illustrating change of a pitch and change of an induced overlay in a reference sample, and to FIG. 8B, a graph showing relationship between the change of the pitch and the change of the overlay plotted in x-y coordinates, consistent with some embodiments of the present disclosure. As shown in FIG. 8A, a pattern B' has an induced overlay $O_1$ with respect to a pattern A. Induced overlay $O_1$ may be determined by a difference between a pitch $P'_{BA}$ and a pitch $P'_{AB}$. Now, pattern B' is shifted to the left to form a pattern B". Pattern B" has an induced overlay $O_2$ with respect to pattern A. Then, the decrease of the overlay value (i.e., $\Delta O = O_2 - O_1$) is the same as the increase of the pitch from pattern B' to pattern B" (i.e., $\Delta P_{B'A} = P_{B''A} - P'_{BA}$). In other words, the ratio between the change of the pitch and the change of the overlay equals to approximately −1 (i.e., $\Delta P_{B'A}/\Delta O \approx -1$). This relationship between the change of $P'_{BA}$ and the change of overlay O is shown in FIG. 8B.

In FIG. 8B, each of the data points is plotted using a pitch value, and an induced overlay value corresponding to the pitch value. In some embodiments, the data points, four data points in this case, are obtained from four different patterns disposed on different areas of a wafer. A linear fitting is then applied to the plotted data. In an ideal case, since the change of the pitch is proportional to the change of the induced overly, the slope of the graph in FIG. 8B is $\Delta P_{B'A}/\Delta O$, which is approximately equal to −1. Therefore, the slope in FIG. 8B indicates an ideal operating state of SEM, and a deviation of a slope from −1 indicates deviation of the SEM from the ideal operating state. Using this principle, linearity calibration can be performed on a SEM, that is, plotting pitch values as a function of induced overlays, applying linear fitting to the plotted data, obtaining a slope of the linear fitting, and performing calibration on the SEM until the slope of the linear fitting equals to −1, as described below.

Figure 9A:
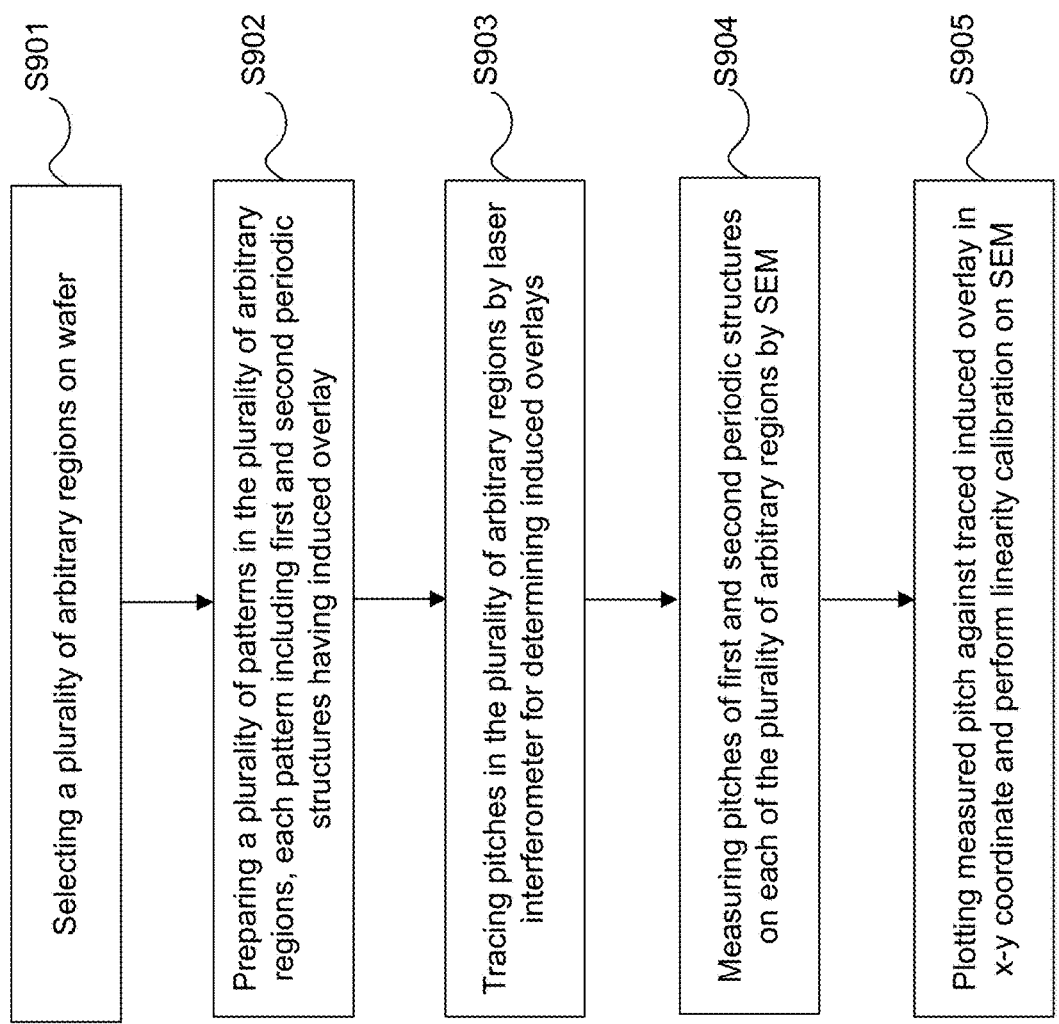
FIG. 9A is a flow chart illustrating another exemplary method of manufacturing a reference sample for calibrating a SEM, consistent with some embodiments of the present disclosure.

References are now made to FIG. 9A, a flow chart illustrating an exemplary method of manufacturing a reference sample and calibrating a SEM, consistent with some embodiments of the present disclosure. It is appreciated that a manufacturing system (e.g., reference sample manufacturing system 110 and laser interferometer 112) can be used for manufacturing the reference sample in steps S901-903.

In FIG. 9A, the method includes a step S901 of selecting a plurality of regions on a wafer to be used as a reference sample. In some embodiments, the regions are arbitrarily or randomly selected, such as based on a plurality of random numbers. In other embodiments, the regions are selected based on other criteria. In a step S902, on each of the plurality of regions, patterns including a first periodic structure and a second periodic structure having an induced CD (e.g., induced overlay, induced line widths) are prepared. In some embodiments, the first periodic structure and the second periodic structure are a set of periodic lines as shown in FIG. 4A. Referring to FIG. 4A as an example, pattern A and pattern B may be formed using a double-patterning scheme during manufacturing. The double-patterning scheme can involve using two separate lithography and etch steps (one for pattern A and another for pattern B) on a layer.

In some embodiments, each of the plurality of regions has an induced overlay value different from the induced overlay values of other regions. In some embodiments, the induced overlay values of the plurality of regions are randomly chosen using a plurality of random numbers. In a step S903, during the manufacturing of the reference sample using the two sets of structures, the pitches of the first periodic structure and the second periodic structure on each of the plurality of regions are traced by a laser interferometer, such as by a laser interferometer of a photolithography scanner. Actual induced overlay values are further determined from the pitches. In some embodiments, in addition to the pitches, the CDs (e.g., CD of FIG. 4A) of the plurality of regions are also traced by the laser interferometer. The traceability data can be stored and can be utilized for calibrating the SEM.

After the manufacturing of the reference sample, the reference sample and traceability data can be provided to a SEM for calibrating. In a step S904, the pitches or the CDs of the plurality of regions are measured by the SEM to be calibrated. From the pitches of the plurality of regions measured by the SEM, a plurality of measured overlay values can be further determined.

Then, in a step S905, the pitches or CDs or overlay values of the plurality of regions measured by the SEM are plotted in x-y coordinates as a function of the actual overlay values that corresponds to values traced to the laser interferometer of the manufacturing system (e.g., scanner). A linear fitting is applied to the plotted data, and a slope of the linear fitting is obtained from the plotted data. In a desired situation, the slope of linear fitting is 1 (or −1) because the induced overlay linearly decreases or increases with pitch or CD. Deviation of the slope from 1 or −1 indicates deviation of the SEM system from a desired situation. The linearity calibration can be performed by manipulating the parameters of the SEM (e.g., magnification or other measurement algorithm) until the slope of the linear fitting is substantially equal to 1 or −1. By printing a plurality of patterns having different induced overlay values on a plurality of regions across the wafer, the calibration takes the non-uniformity (e.g., a scanning distortion caused by a non-uniform electromagnetic field generated by an electromagnetic deflector) into account. Moreover, by randomizing the layout of the plurality of patterns on the reference sample, an overlay error caused during the manufacturing process may be reduced to a noise level as some induced offsets (the correlation between positions on the wafer) and overlay errors caused by manufacturing may break, thereby transforming the overlay errors into random noise that will not influence the slope from the linear fitting procedure and further enhancing the accuracy of the calibration.

Figure 9B:
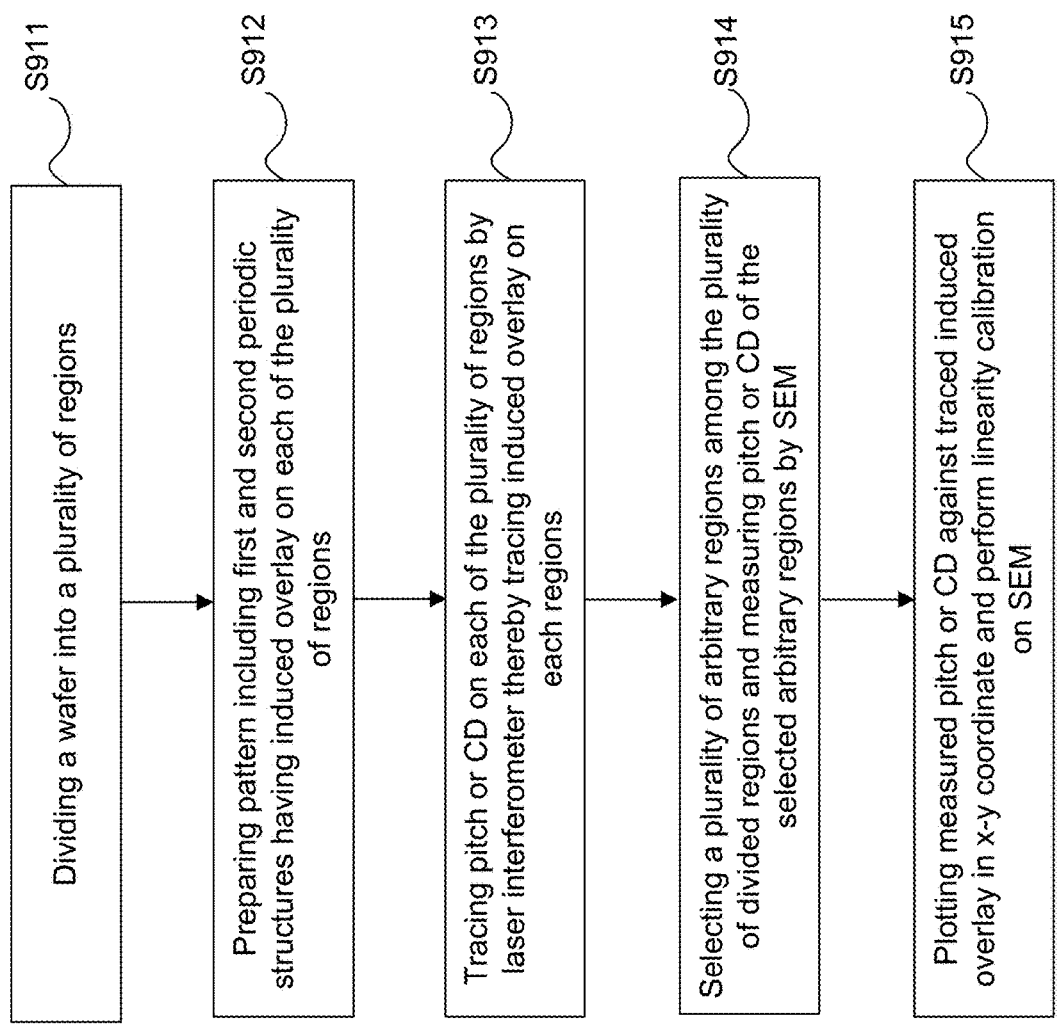
FIG. 9B is a flow chart illustrating another exemplary method of manufacturing a reference sample for calibrating a SEM, consistent with some embodiments of the present disclosure.

References are now made to FIG. 9B, a flow chart illustrating another exemplary method of manufacturing a reference sample and calibrating a SEM, consistent with some embodiments of the present disclosure. It is appreciated that a manufacturing system (e.g., reference sample manufacturing system 110 and laser interferometer 112) can be used for manufacturing the reference sample in steps S911-913.

In FIG. 9B, the method includes a step S911 of dividing a wafer into a plurality of regions. In some embodiments, the regions may be equally divided based on a preset algorithm. In a step S912, on each of the plurality of regions, a pattern including a first periodic structure and a second periodic structure having an induced CD (e.g., induced overlay, induced line widths) is prepared. In some embodiments, the first periodic structure and the second periodic structure are a set of periodic lines as shown in FIG. 4A. In some embodiments, each of the plurality of regions has an induced overlay value different from the induced overlay values of other regions. In some embodiments, the induced overlay values of the plurality of regions are random numbers generated by a random number generator. Referring to FIG. 4A as an example, pattern A and pattern B may be formed using a double-patterning scheme during manufacturing. The double-patterning scheme can involve using two separate lithography and etch steps (one for pattern A and another for pattern B) on a layer.

In a step S913, the pitches of the first periodic structure and the second periodic structure on each of the plurality of regions are traced by a laser interferometer, and an actual induced offset value is determined from the pitches. In some embodiments, in addition to the pitches, the CDs of the plurality of regions are also traced by the laser interferometer. The traceability data can be stored and can be utilized for calibrating the SEM.

After the manufacturing of the reference sample, the reference sample and traceability data can be provided to a SEM for calibrating. In a step S914, a plurality of regions from among the plurality of divided regions are selected. In some embodiments, the plurality of regions is selected by the SEM. In some embodiments, the plurality of regions is manually selected by an operator of the SEM. After the selection, the pitches or CDs of the plurality of regions are measured by the SEM to be calibrated. From the pitches of the plurality of regions measured by the SEM, a plurality of measured overlay values can be further determined.

Then, in a step S915, the pitches, CDs, or induced overlay values of the plurality of regions measured by the SEM are plotted in x-y coordinates as a function of the actual induced overlay values that corresponds to values traced to the laser interferometer of the manufacturing system. A linear fitting is applied to the plotted data and a slope of the linear fitting is obtained from the plotted data. In a desired situation, the slope of linear fitting is 1 (or −1) because the induced overlay linearly decreases or increases with pitch. Deviation of the slope from 1 or −1 indicates deviation of the SEM system from a desired situation. The linearity calibration can be performed by manipulating the parameters of the SEM, for example, magnification or other measurement algorithm, until the slope of the linear fitting substantially equals to 1 or −1. Again, by printing a plurality of patterns having different induced overlay values on a plurality of regions across the wafer, the calibration takes the non-uniformity into account, for example, a scanning distortion caused by a non-uniform electromagnetic field generated by an electromagnetic deflector. Moreover, by randomizing the layout of the plurality of patterns on the reference sample, an overlay error caused during the manufacturing process may be reduced to a noise level as some induced offsets (the correlation between positions on the wafer) and overlay errors caused by manufacturing may break, thereby transforming the overlay errors into random noise that will not influence the slope from the linear fitting procedure and further enhancing the accuracy of the calibration.

Figure 10A:
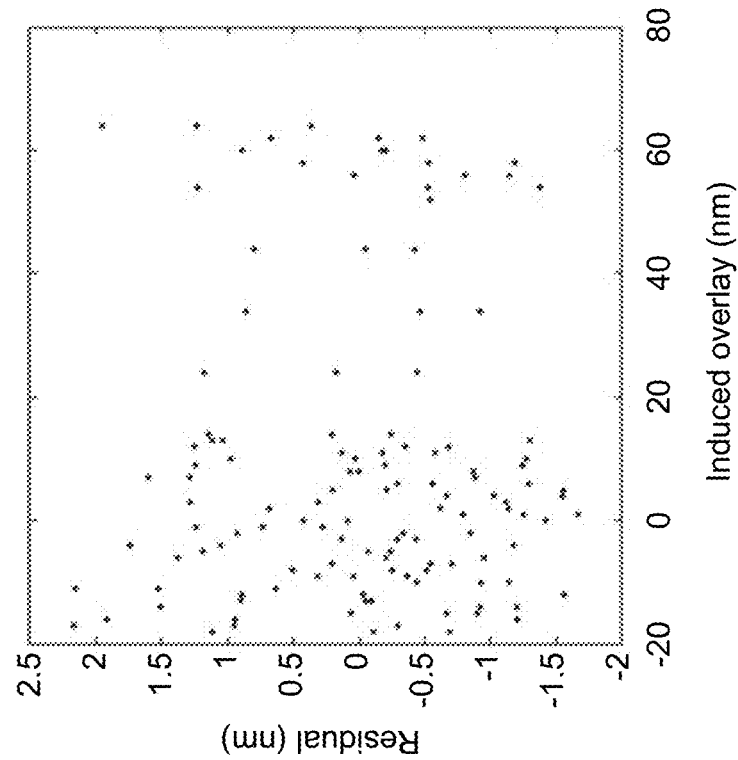
FIG. 10A is a graph showing an example of linearity calibration of a SEM and FIG. 10B is a graph showing residual values of the linearity calibration in FIG. 9A, consistent with some embodiments of the present disclosure.
Figure 10B:
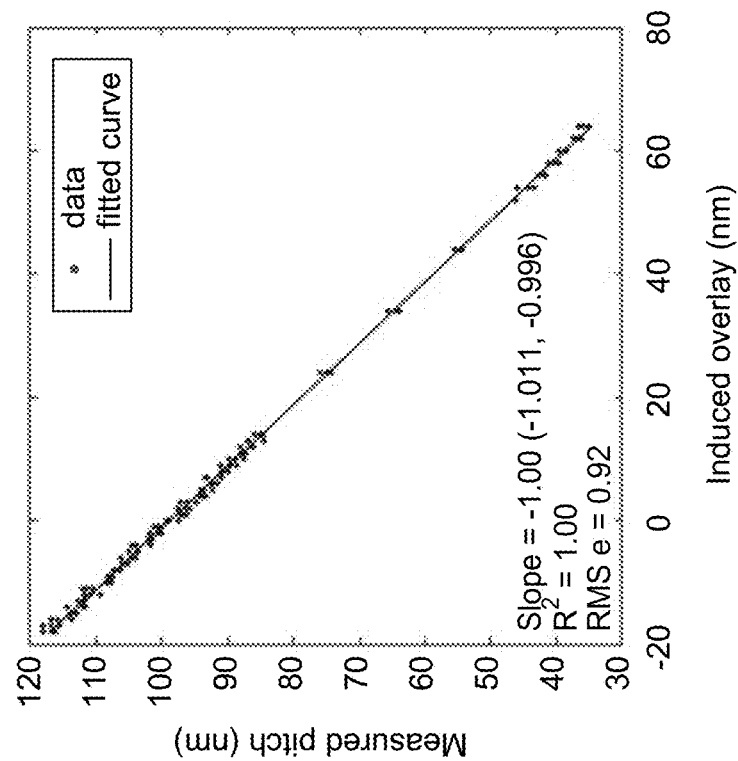

References are now made to FIG. 10A, a graph showing an example of linearity calibration of a SEM. As shown in FIG. 10A, the graph shows induced overlay (nm) traced by a laser interferometer ("Induced overlay") on the x-axis and the pitches (nm) measured by the SEM ("Measured pitch") on the y-axis. A linear fitting is applied to the data points. The obtained slope is −1.00, indicating a good calibration result. In some embodiments, the slope may be ranged between −1.1 to −0.9, depending on the requirement of calibration accuracy. A coefficient of determination ($R^2$ or the fraction of observed variance explained by the model/fitting) is 1.00, indicating goodness of the linear fitting, and a root mean square deviation is 0.92, indicating small variations of the data points across the entire wafer and an accurate calibration result. FIG. 10B is a graph showing a range of residual values of the plot in FIG. 10A, consistent with some embodiments of the present disclosure. The range of the residual is shown to be in a range between −2.0 nm to 2.5 nm, approximately within a noise level of the system, further indicating the quality of the calibration. When the slope of the linear fitting largely deviates from 1 or −1, a linearity calibration may be performed by manipulating the parameters of the SEM, for example, magnification or other measurement algorithm, until the slope is substantially equal to 1 or −1. When the coefficient of determination, the root mean square deviation, or the residual is shown to be too large, a calibration that targets to increase the uniformity of the SEM may be performed.

Figure 11A:
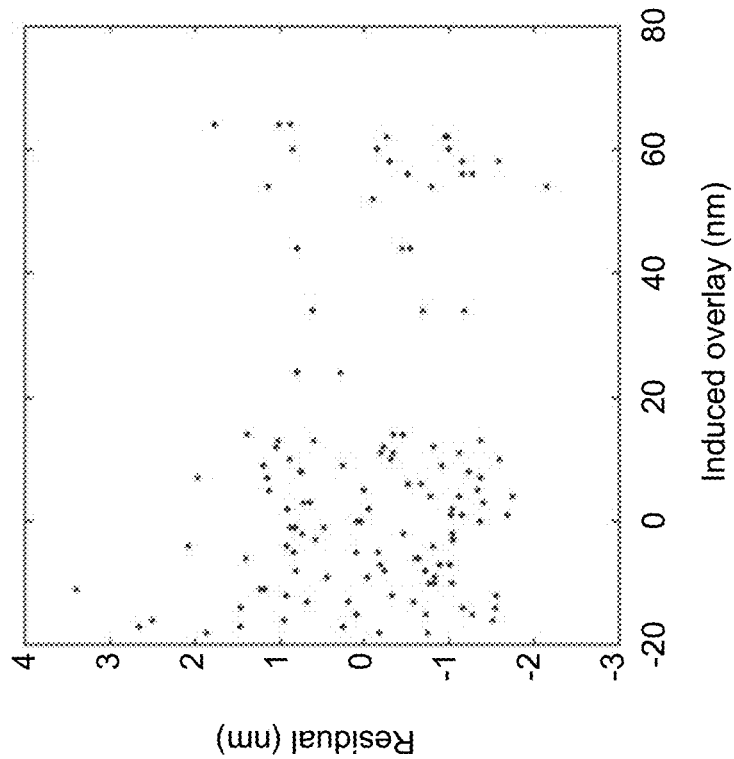
FIG. 11A is a graph showing another example of linearity calibration of a SEM and FIG. 11B is a graph showing residual values of the linearity calibration in FIG. 11A, consistent with some embodiments of the present disclosure.
Figure 11B:
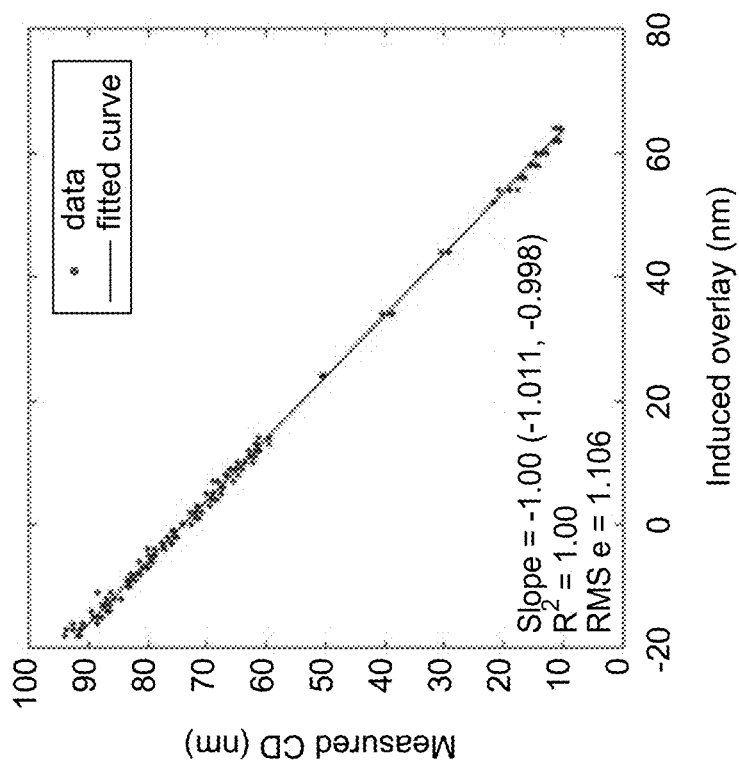

References are now made to FIG. 11A, another example of linearity calibration of a SEM. As shown in FIG. 11A, the graph shows induced overlay (nm) traced by a laser interferometer ("Induced overlay") on the x-axis and the critical dimensions (nm) measured by the SEM ("Measured CD") on the y-axis. A linear fitting is applied to the plotted data points and a slope of the linear fitting is obtained. The obtained slope is −1.00, indicating a good calibration result. A coefficient of determination is 1.00, indicating that there is little discrepancy of the linear fitting, and a root mean square deviation is 1.06, indicating small variations of the data points across the entire wafer and an accurate calibration result. FIG. 11B is a graph showing a range of the residual values of the plot in FIG. 11A, consistent with some embodiments of the present disclosure. The residual values are in a range between −2.2 nm to 3.5 nm, within an acceptable noise level of the system, further indicating the quality of the calibration. When the slope of the linear fitting largely deviates from 1 or −1, a linearity calibration may be performed by manipulating the parameters of the SEM, for example, magnification or other measurement algorithm, until the slope is substantially equal to 1 or −1. When the coefficient of determination, the root mean square deviation, or the residual is shown to be too large, a calibration that targets to increase the uniformity of the SEM may be performed.

References are now made to FIG. 12A, another example of linearity calibration of a SEM. As shown in FIG. 12A, the graph shows induced overlay (nm) traced by a laser interferometer ("Induced overlay") on the x-axis and the induced overlay (nm) measured by the SEM ("Measured overlay") on the y-axis. A linear fit is applied to the plotted data points. The obtained slope is 1.01, indicating a good calibration result. A coefficient of determination is 0.99 indicating that there is little discrepancy of the linear fitting, and a root mean square deviation is 0.94, indicating small variations of the data points across the entire wafer and accurate calibration results. FIG. 12B is a graph showing a range of the residual values of the plot in FIG. 12A, consistent with some embodiments of the present disclosure. The range of the residual is shown to be in a range between −2.2 nm to 1.75 nm, within a noise level of the system, further indicating the quality of the calibration. When the slope of the linear fitting largely deviates from 1 or −1, a linearity calibration may be performed by manipulating the parameters of the SEM, for example, magnification or other measurement algorithm, until the slope is substantially equal to 1 or −1. When the coefficient of determination, the root mean square deviation, or the residual is shown to be too large, a calibration that targets to increase the uniformity of the SEM may be performed.

References are now made to FIG. 13A, a schematic diagram illustrating a top plan view of a reference sample having 2-dimensional line patterns without overlay error, consistent with some embodiments of the present disclosure. The periodic line patterns in FIG. 13A extend in the x and y directions. In the x-direction, a periodic line pattern A is interleaved with a periodic line pattern B, with a critical dimension of $CD_X$. A pitch $P_{AB,X}$ is determined by a separation from a left edge of a line in pattern A to a left edge of an adjacent line in pattern B in the measurement direction. Similarly, a pitch $P_{BA,X}$ is determined by a separation from a left edge of a line in pattern B to a left edge of an adjacent line in pattern A in the measurement direction. An overlay between the pattern A and the pattern B is obtained by subtracting $P_{BA,X}$ from $P_{AB,X}$, resulting in an overlay of zero in FIG. 13A.

Similarly, in the y-direction, a periodic line pattern A is interleaved with a periodic line pattern B, with a critical dimension of CDy. A pitch $P_{AB,Y}$ is determined by a separation from a left edge of a line in pattern A to a left edge of an adjacent line in pattern B in the measurement direction. Similarly, a pitch $P_{BA,Y}$ is determined by a separation from a left edge of a line in pattern B to a left edge of an adjacent line in pattern A in the measurement direction. An overlay between the pattern A and the pattern B is obtained by subtracting $P_{BA,Y}$ from $P_{AB,Y}$, resulting in an overlay of zero in FIG. 13A. Similar to the configuration in FIG. 3, FIG. 13A depicts an ideal situation in which the overlay is zero.

During calibration of a SEM, such as electron beam tool 126 of FIG. 2, the reference sample is placed inside the chamber of the SEM. The SEM measures pitch $P_{AB,X}$ or CDx in the x direction and pitch $P_{AB,Y}$ or CDy in the y direction of the reference sample. The pitches or CDs in the x and y directions measured by the SEM are compared with the pitches or CDs in the x and y directions traced by an edge-sensitive instrument (e.g., such as a laser interferometer) to perform the calibration. By considering the pitches or CDs in both the x and y directions, the accuracy of the calibration is further enhanced.

References are now made to FIG. 13B, a schematic diagram illustrating a top plan view of a reference sample having 2-dimensional line patterns with induced overlays, consistent with some embodiments of the present disclosure. Compared with FIG. 13A, the reference sample in FIG. 13B has induced overlays in the x-direction and the y-direction, that can be obtained, for example, by a double-patterning method. In the x-direction, a periodic line pattern A is interleaved with a periodic line pattern B, with a critical dimension of CDx. A pitch $P_{AB,X}$ is determined by a separation from a left edge of a line in pattern A to a left edge of an adjacent line in pattern B in the measurement direction. Similarly, a pitch $P_{BA,X}$ is determined by a separation from a left edge of a line in pattern B to a left edge of an adjacent line in pattern A in the measurement direction. An overlay between the pattern A and the pattern B is obtained by subtracting $P'_{BA,X}$ from $P'_{AB,X}$, resulting in a non-zero overlay value in the situation of FIG. 12B.

Similarly, in the v-direction, a periodic line pattern A is interleaved with a periodic line pattern B, with a critical dimension of CDy. A pitch $P_{AB,Y}$ is determined by a separation from a left edge of a line in pattern A to a left edge of an adjacent line in pattern B in the measurement direction. Similarly, a pitch $P_{BA,Y}$ is determined by a separation from a left edge of a line in pattern B to a left edge of an adjacent line in pattern A in the measurement direction. An overlay between the pattern A and the pattern B is obtained by subtracting $P_{BA,Y}$ from $P_{AB,Y}$, resulting in a non-zero overlay value. In addition to considering a natural overlay errors in calibration, this method further takes variations in both x and y axes into account, thereby further enhancing the accuracy of the calibration.

Figure 14A:
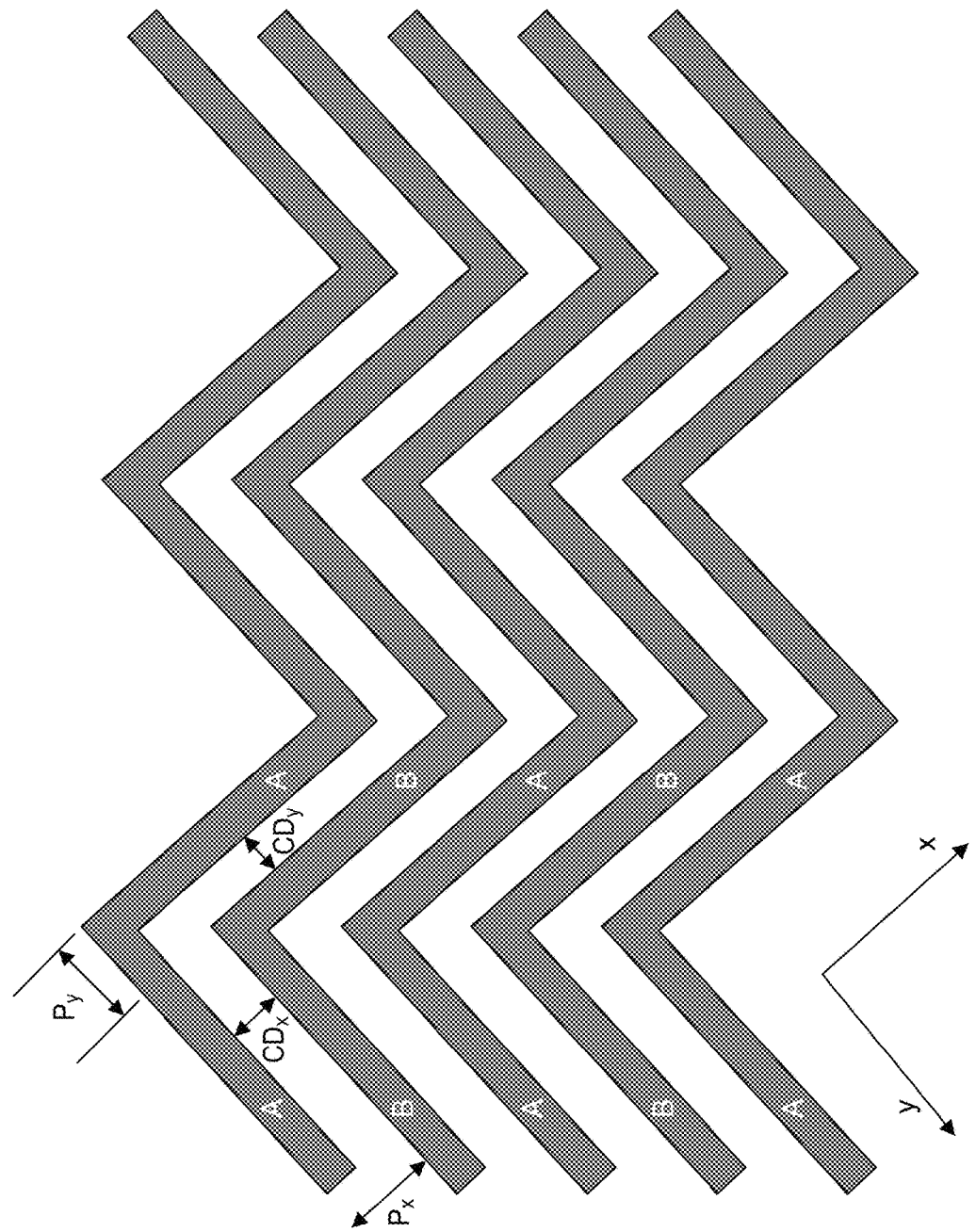
FIG. 14A is a schematic diagram illustrating a top plan view of another reference sample having 2-dimensional line patterns without overlay error.
Figure 14B:
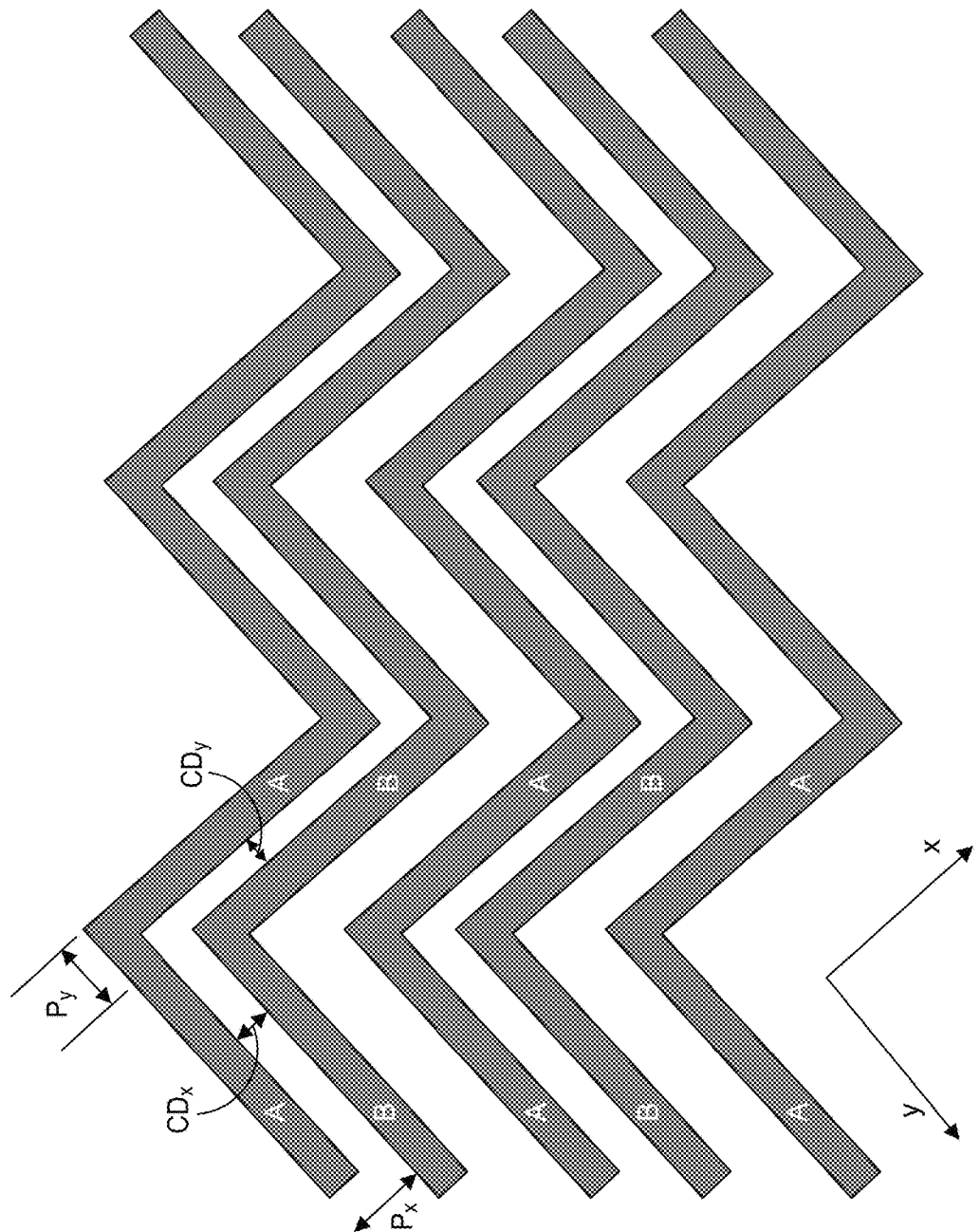
FIG. 14B is a schematic diagram illustrating a top plan view of another reference sample having 2-dimensional line patterns with induced overlays, consistent with some embodiments of the present disclosure.

References are now made to FIG. 14A, a schematic diagram showing a top plan view of another reference sample having 2-dimensional line patterns without overlay error, and FIG. 14B, a schematic showing a top plan view of another reference sample having 2-dimensional line patterns with induced overlays, consistent with some embodiments of the present disclosure. The reference sample in FIGS. 14A and 14B have a plurality of the patterns in FIGS. 13A and 13B, respectively, oriented approximately diagonal directions of the FIGS. 13A and 13B. In this way, the calibration can be performed by considering different directions, further enhancing the accuracy of the calibration.

Figures 15A, 15B:
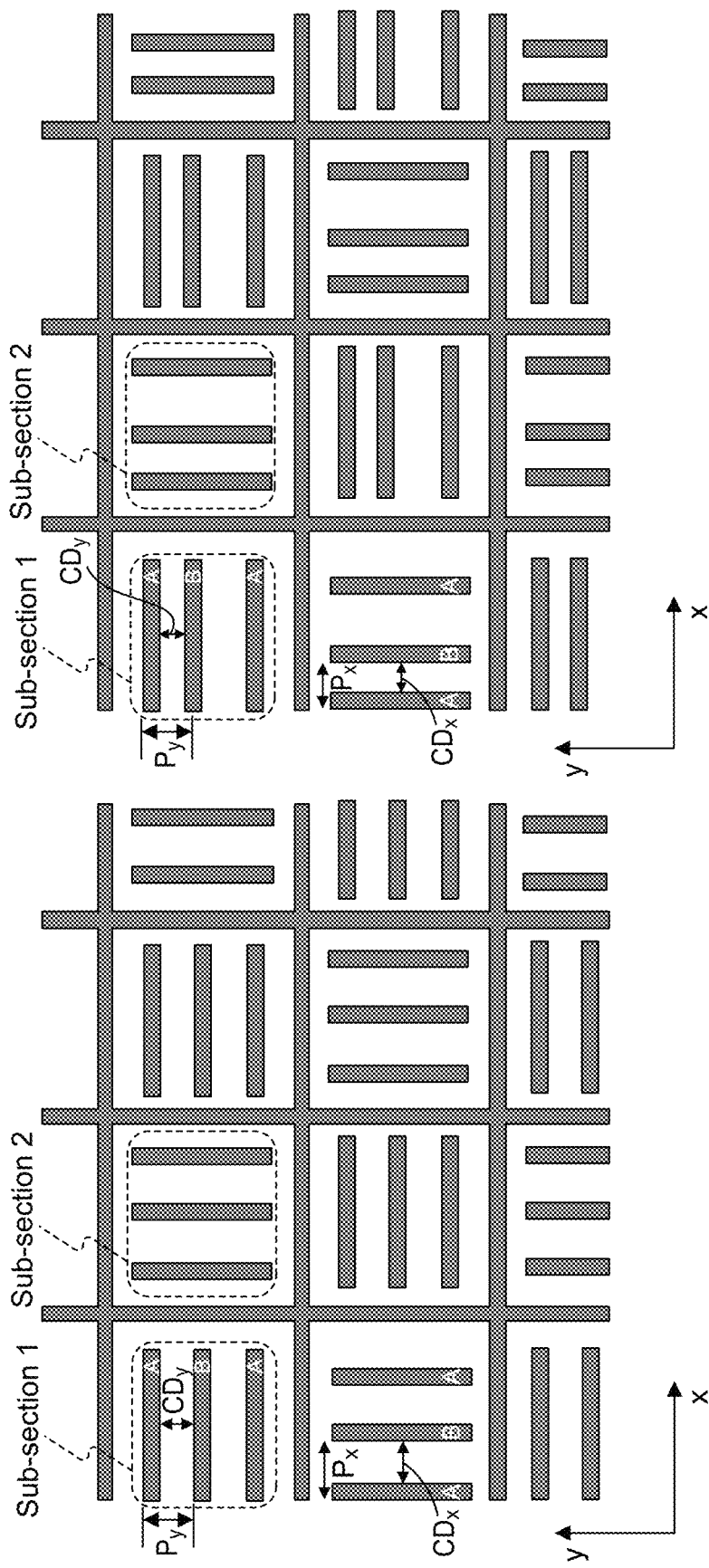
FIG. 15A is a schematic diagram illustrating a top plan view of another reference sample having 2-dimensional line patterns without overlay error.
FIG. 15B is diagram illustrating a top plan view of another reference sample having 2-dimensional line patterns with induced overlays, consistent with some embodiments of the present disclosure.

References are now made to FIG. 15A, a schematic diagram showing a top plan view of another reference sample having 2-dimensional line patterns without overlay error, and FIG. 15B, a schematic diagram showing a top plan view of another reference sample having 2-dimensional line patterns with induced overlays, consistent with some embodiments of the present disclosure. In FIG. 15A, along a direction, such as y-direction, the first periodic structure further comprises a plurality of first periodic sub-structures A and a plurality of second periodic sub-structures B disposed on different areas such as sub-section 1 of the reference sample. The reference sample further includes third periodic sub-structures A and a plurality of fourth periodic sub-structure B arranged along another direction, such as x-direction, disposed on different areas such as sub-section 2 of the reference sample. In FIG. 15B the reference sample includes a plurality of first periodic sub-structures A and a plurality of second periodic sub-structures B with induced offset with respect to the first periodic sub-structures A arranged along y-direction disposed on different areas such as sub-section 1 of the reference sample. The reference sample further includes a plurality of third periodic sub-structures A and a plurality of fourth periodic sub-structures B with induced offset with respect to the third periodic sub-structures A arranged along another direction, such as x-direction, disposed on different areas such as sub-section 2 of the reference sample. Calibration of a SEM using this reference sample provides a benefit that for a wafer with a surface area, different separate regions of the wafer can be used to form patterns for increasing the number of data points and calibration accuracy. Also, the separate regions are less likely to affect other un-connected patterns. FIGS. 13A-15B are merely some examples of 2-dimential reference sample patterns. Calibrations using these 2D references are similar to those of 1-D reference samples (e.g., FIG. 4A). The difference is that in FIGS. 13A-15B, the measurement is additionally performed in another direction, e.g. y-axis direction.

The embodiments may further be described using the following first set of clauses:

1. A method for calibrating a scanning electron microscope (SEM), comprising:
providing a reference sample including a first periodic structure interleaved with a second periodic structure, each of the first periodic structure and second periodic structure having a period along a measurement direction;
measuring, by the SEM, an offset between the first periodic structure and the second periodic structure;
comparing the measured offset with an induced offset; and
calibrating the SEM based on the comparison.
2. The method of clause 1, wherein the induced offset comprises an offset deliberately introduced to the reference sample.
3. The method of clause 2, wherein the induced offset further comprises an offset caused by an overlay error during a manufacturing process of the reference sample.
4. The method of any one of clauses 1 to 3, wherein the induced offset is traceable to a laser interferometer of a photolithography scanner.
5. The method of any one of clauses 1 to 4, wherein the offset measured by the SEM is based on an image of the reference sample obtained by the SEM, and wherein a left edge and a right edge of the first and second periodic structures on the image appear asymmetrical.
6. The method of any one of clauses 1 to 5, wherein the first periodic structure and the second periodic structure are on different layers of a wafer.
7. The method of any one of clauses 1 to 6, wherein each of the first periodic structure and the second periodic structure comprises a set of periodic lines.
8. The method of any one of clauses 1 to 7, further comprising:
tracing a critical dimension of the first and second periodic structures; and
measuring, by the SEM, the critical dimension of the first and second periodic structures,
wherein calibrating the SEM further comprises calibrating the SEM based on a correlation between the measured critical dimension and the traced critical dimension of the first and second periodic structures.
9. The method of any one of clauses 1 to 8, further comprising:
tracing a line width of the first periodic structure or the second periodic structure; and
measuring, by the SEM, the line width of the first periodic structure or the second periodic structure,
wherein calibrating the SEM further comprises calibrating the SEM based on a correlation between the measured line width and the traced line width of the first periodic structure or the second periodic structure.
10. The method of clause 1, wherein:
the first periodic structure includes a first set of lines extending in a first direction and a second set of lines that are connected with the first set of lines and extending in a second direction; and
the second periodic structure includes a third set of lines extending in a first direction and a fourth set of lines that are connected with the third set of lines and extending in a second direction.
11. The method of clause 1, wherein:
the first periodic structure further comprises a plurality of first periodic sub-structures disposed on different areas of the reference sample,
the second periodic structure further comprises a plurality of second periodic sub-structures disposed on different areas of the reference sample, and
each of the plurality of first periodic sub-structures is paired with a corresponding one of the plurality of second periodic sub-structures to form a plurality of pairs of first and second periodic sub-structures.
12. A method for calibrating a scanning electron microscope (SEM), comprising:
selecting a plurality of regions on a wafer;
preparing, on each of the plurality of regions, a pattern including a first periodic structure interleaved with a second periodic structure, the first and second periodic structures having an induced offset;
tracing pitches of the first and second periodic structures or the induced offset on each of the plurality of regions;
measuring, by the SEM, the pitches of the first and second periodic structures on each of the plurality of regions; and
performing a linearity calibration on the SEM based on the tracing and the measuring.
13. The method of clause 12, wherein tracing the pitches of the first and second periodic structures or the induced offset on each of the plurality of regions further comprises:
tracing, by a laser interferometer, the pitches of the first and second periodic structures or the induced offset on each of the plurality of regions.
14. The method of any one of clauses 12 to 13, wherein performing the linearity calibration on the SEM further comprising:
plotting the measured pitches as a function of the traced induced offsets in x-y coordinates.
15. The method of clause 14, further comprising:
applying a linear fitting to the plotting;
obtaining a slope of the linear fitting;
comparing the slope with 1 or −1; and
performing a calibration based on a deviation of the slope from 1 or −1.
16. The method of clause 15, further comprising:
determining at least one of a coefficient of determination, a root mean square deviation, or a range of residual values of the linear fitting.
17. The method of any one of clauses 12 to 16, wherein the induced offsets of the plurality of regions are different from each other.
18. The method of any one of clauses 12 to 17, wherein the plurality of regions on the wafer are selected based on random numbers generated by a random number generator.
19. The method of any one of clauses 12 to 18, wherein:
each of the first and second periodic structures further comprises a plurality of sub-structures periodically extending in 2 dimensions, and performing the linearity calibration on the SEM further comprises performing linearly calibration based on data obtained in a first direction and data obtained in a second direction, the second direction is substantially perpendicular to the first direction.

20. A method for calibrating a scanning electron microscope (SEM), comprising:
preparing, on each of a plurality of regions of a wafer, a pattern including a first periodic structure interleaved with a second periodic structure, the first and second periodic structures having an induced offset;
tracing pitches of the first and second periodic structures and the induced offset on each of the plurality of regions;
selecting a plurality of regions from the plurality of regions;
measuring, by the SEM, pitches of first and second periodic structures on the selected regions; and
performing linearity calibration on the SEM.

21. The method of clause 20, wherein tracing the pitches of the first and second periodic structures further comprising:
tracing, by a laser interferometer, the pitches of the first and second periodic structures thereby tracing the induced offset on each of the plurality of regions.

22. The method of any one of clauses 20 to 21, wherein performing the linearity calibration on the SEM further comprising:
plotting the measured pitches as a function of the traced induced offsets in x-y coordinate.

23. The method of clause 22, further comprising:
applying a linear fitting to the plotting;
obtaining a slope of the linear fitting;
comparing the slope with 1 or −1; and
performing a calibration based on a deviation of the slope from 1 or −1.

24. The method of clause 23, further comprising:
determining at least one of a coefficient of determination, a root mean square deviation, or a range of residual values of the liner fitting.

25. The method of any one of clauses 20 to 24, wherein the induced offsets of the plurality of regions are different from each other.

26. The method of any one of clauses 20 to 25, wherein the plurality of regions on the wafer are automatically selected by the SEM.

27. The method of any one of clauses 20 to 25, wherein the plurality of regions on the wafer are manually selected by an operator.

28. The method of any one of clauses 20 to 25, wherein:
each of the first and second periodic structures further comprises a plurality of sub-structures periodically extending in 2 dimensions, and
performing the linearity calibration on the SEM further comprises performing linearly calibration based on data obtained in a first direction and data obtained in a second direction, the second direction is substantially perpendicular to the first direction.

29. The method of any one of clauses 20 to 28, wherein:
tracing the pitches further comprises tracing critical dimension of the first and second periodic structures on each of the plurality of regions, and
measuring the pitches further comprises measuring, by the SEM, the critical dimension of the first and second periodic structures on each of the plurality of regions.

30. A system for calibrating a scanning electron microscope (SEM), comprising:
a wafer holder configured to hold a sample; and
a controller having circuitry configured to:
measure a pitch between a first periodic structure and a second periodic structure of the sample, wherein at least one of the periodic structures has an induced offset, and wherein the first periodic structure is interleaved with the second periodic structure;
compare the measured pitch with a traced pitch of the first and second periodic structures; and
perform the calibration based on the comparison.

31. The system of clause 30, wherein the controller has circuitry further configured to acquire an image of the sample having the first and second periodic structures.

32. The system of clause 30 or 31, wherein the first periodic structure comprises a plurality of first periodic structures and the second periodic structure comprises a plurality of second periodic structures.

33. The system of clause 32, wherein the controller has circuitry further configured to measure a plurality of pitches between the plurality of first and second periodic structures.

34. The system of clause 33, wherein the controller has circuitry further configured to:
plot the measured pitches as a function of a plurality of traced induced offsets in x-y coordinates;
apply a linear fitting to the plotted data;
obtain a slope of the linear fitting;
compare the slope with 1 or −1; and
calibrate the SEM based on a deviation of the slope from 1 or −1.

35. A reference sample for calibration, comprising:
a first periodic structure having a period along a measurement direction; and
a second periodic structure that has the period along the measurement direction and offsets from the first periodic structure,
wherein the offset between the first periodic structure and the second periodic structure is an induced offset deliberately introduced to the reference sample.

36. A method of characterizing metrology-related errors, the method comprising:
measuring distances between asymmetric edges of a plurality of corresponding pairs of first and second structures patterned on a sample, wherein each of the second structures has a different characterized offset from a corresponding paired first structure; and
determining the metrology-related error based on the measured distances and the different characterized offsets. sample 37. The method of clause 36, wherein the asymmetric edges include a first edge of a first structure and an adjacent second edge on an opposite side of the first structure.

38. The method of clause 37, wherein the asymmetric edges include a third edge of a second structure and a fourth edge of a third structure, wherein the third edge and the fourth edge are adjacent and the second structure and the third structure are adjacent.

The embodiments may further be described using the following second set of clauses:

1. A method for calibrating a scanning electron microscope (SEM), comprising:
providing a reference sample including a first periodic structure interleaved with a second periodic structure, each of the first periodic structure and second periodic structure having a period along a measurement direction;
measuring, by the SEM, an offset between the first periodic structure and the second periodic structure;

comparing the measured offset with an induced offset; and
calibrating the SEM based on the comparison.

2. The method of clause 1, wherein the induced offset comprises an offset deliberately introduced to the reference sample.

3. The method of clause 2, wherein the induced offset further comprises an offset caused by an overlay error during a manufacturing process of the reference sample.

4. The method of any one of clauses 1-3, wherein the induced offset is traceable to a laser interferometer or is obtained by tracing using a laser interferometer.

5. The method of any one of clauses 1-4, wherein the offset measured by the SEM is based on an image of the reference sample obtained by the SEM, and a left edge and a right edge of the first and second periodic structures on the image are asymmetrical.

6. The method of any one of clauses 1-5, wherein the first periodic structure and the second periodic structure are on different layers of a wafer.

7. The method of any one of clauses 1-6, wherein each of the first periodic structure and the second periodic structure comprises a set of periodic lines.

8. The method of any one of clauses 1-7, further comprising:
tracing a critical dimension of the first and second periodic structures; and
measuring, by the SEM, the critical dimension of the first and second periodic structures,
wherein calibrating the SEM further comprises calibrating the SEM based on a correlation between the measured critical dimension and the traced critical dimension of the first and second periodic structures.

9. The method of any one of clauses 1-8, further comprising:
tracing a line width of the first periodic structure or the second periodic structure; and
measuring, by the SEM, the line width of the first periodic structure or the second periodic structure,
wherein calibrating the SEM further comprises calibrating the SEM based on a correlation between the measured line width and the traced line width of the first periodic structure or the second periodic structure.

10. The method of clause 1, wherein:
the first periodic structure includes a first set of lines extending in a first direction and a second set of lines that are connected with the first set of lines and extending in a second direction; and
the second periodic structure includes a third set of lines extending in a first direction and a fourth set of lines that are connected with the third set of lines and extending in a second direction.

11. The method of clause 1, wherein:
the first periodic structure further comprises a plurality of first periodic sub-structures disposed on different areas of the reference sample,
the second periodic structure further comprises a plurality of second periodic sub-structures disposed on different areas of the reference sample, and
each of the plurality of first periodic sub-structures is paired with a corresponding one of the plurality of second periodic sub-structures to form a plurality of pairs of first and second periodic sub-structures.

12. A method for calibrating a scanning electron microscope (SEM), comprising:
selecting a plurality of arbitrary regions on a wafer;
preparing, on each of the plurality of arbitrary regions, a pattern including a first periodic structure interleaved with a second periodic structure, the first and second periodic structures having an induced offset;
tracing pitches of the first and second periodic structures and the induced offset on each of the plurality of arbitrary regions;
measuring, by the SEM, the pitches of the first and second periodic structures on each of the plurality of arbitrary regions; and
performing a linearity calibration on the SEM based on the tracing and the measuring.

13. The method of clause 12, wherein tracing the pitches of the first and second periodic structures further comprises:
tracing, by a laser interferometer, the pitches of the first and second periodic structures and the induced offset on each of the plurality of arbitrary regions.

14. The method of any one of clauses 12-13, wherein performing the linearity calibration on the SEM further comprising:
plotting the measured pitches as a function of the traced induced offsets in x-y coordinates.

15. The method of clause 14, further comprising:
applying a linear fitting to the plotting;
obtaining a slope of the linear fitting;
comparing the slope with 1 or −1; and
performing a calibration based on a deviation of the slope from 1 or −1.

16. The method of clause 15, further comprising:
determining at least one of a variance, a root mean square deviation, or a range of residual values of the linear fitting.

17. The method of any one of clauses 12-16, wherein the induced offsets of the plurality of arbitrary regions are different from each other.

18. The method of any one of clauses 12-17, wherein the plurality of arbitrary regions on the wafer are selected based on random numbers generated by a random number generator.

19. The method of any one of clauses 12-18, wherein:
each of the first and second periodic structures further comprises a plurality of sub-structures periodically extending in 2 dimensions, and
performing the linearity calibration on the SEM further comprises performing linearly calibration based on data obtained in a first direction and data obtained in a second direction, the second direction is substantially perpendicular to the first direction.

20. A method for calibrating a scanning electron microscope (SEM), comprising:
preparing, on each of a plurality of regions of a wafer, a pattern including a first periodic structure interleaved with a second periodic structure, the first and second periodic structures having an induced offset;
tracing pitches of the first and second periodic structures and the induced offset on each of the plurality of regions;
selecting a plurality of arbitrary regions from the plurality of regions;
measuring, by the SEM, pitches of first and second periodic structures on the selected arbitrary regions; and
performing linearity calibration on the SEM.

21. The method of clause 20, wherein tracing the pitches of the first and second periodic structures further comprising:
tracing, by a laser interferometer, the pitches of the first and second periodic structures thereby tracing the induced offset on each of the plurality of regions.

22. The method of any one of clauses 20-21, wherein performing the linearity calibration on the SEM further comprising:
plotting the measured pitches as a function of the traced induced offsets in x-y coordinate.

23. The method of clause 22, further comprising:
applying a linear fitting to the plotting;
obtaining a slope of the linear fitting;
comparing the slope with 1 or −1; and
performing a calibration based on a deviation of the slope from 1 or −1.

24. The method of clause 23, further comprising:
determining at least one of a variance, a root mean square deviation, or a range of residual values of the liner fitting.

25. The method of any one of clauses 20-24, wherein the induced offsets of the plurality of regions are different from each other.

26. The method of any one of clauses 20-25, wherein the plurality of arbitrary regions on the wafer are automatically selected by the SEM.

27. The method of any one of clauses 20-25, wherein the plurality of arbitrary regions on the wafer are manually selected by an operator.

28. The method of any, one of clauses 20-25, wherein:
each of the first and second periodic structures further comprises a plurality of sub-structures periodically extending in 2 dimensions, and
performing the linearity calibration on the SEM further comprises performing linearly calibration based on data obtained in a first direction and data obtained in a second direction, the second direction is substantially perpendicular to the first direction.

29. The method of any one of clauses 20-28, wherein:
tracing the pitches further comprises tracing critical dimension of the first and second periodic structures on each of the plurality of arbitrary regions, and measuring the pitches further comprises measuring, by the SEM, the critical dimension of the first and second periodic structures on each of the plurality of arbitrary regions.

30. A system for calibrating a scanning electron microscope (SEM), comprising:
a reference sample including a first periodic structure interleaved with a second periodic structure, the first and second periodic structures having an induced offset;
a laser interferometer having circuitry configured to trace pitches and the induced offset between the first and second periodic structures;
the scanning electron microscope is configured to measure the pitches between the first and second set of periodic structures; and
a controller having circuitry configured to compare the measured pitches with the traced pitches to perform the calibration.

31. The system of clause 30, wherein the first and second periodic structures comprise a plurality of first periodic structures, each of the arbitrary regions have a pair of a first periodic structure and a second periodic structure.

32. The system of clause 31, wherein the first and second periodic structures further comprise a plurality of second periodic structures, each of the arbitrary regions have a pair of a first periodic structure and a second periodic structure.

33. The system of clause 31, wherein the controller is further configured to:
plot the measured pitches as a function of the traced induced offsets in x-y coordinate
apply a linear fitting to the plotted data;
obtain a slope of the linear fitting;
compare the slope with 1 or −1; and
calibrate the SEM based on a deviation of the slope from 1 or −1.

34. A reference sample for calibration, comprising:
a first periodic structure having a period along a measurement direction; and
a second periodic structure that has the period along the measurement direction and offsets from the first periodic structure,
wherein the offset between the first periodic structure and the second periodic structure is an induced offset deliberately introduced to the reference sample.

35. A system for calibrating a scanning electron microscope (SEM), the system comprising:
a stage configured to support a reference sample including a first periodic structure interleaved with a second periodic structure, the first and second periodic structures having an induced offset therebetween;
a laser interferometer;
the SEM; and
a controller configured to:
cause the laser interferometer to trace the induced offset between the first and second periodic structures;
cause the scanning electron microscope to measure the induced offset between the first and second periodic structures; and
compare the measured induced offset with the traced induced offset to perform the calibration.

36. The system of clause 35, wherein the induced offset comprises an offset predefined for the reference sample and an offset caused by an overlay error during a manufacturing process of the reference sample.

37. The system of clause 35, wherein the first periodic structure and the second periodic structure are on different layers of the reference sample 38. The system of clause 35, wherein the measured induced offset is obtained based on an image of the reference sample obtained by the SEM, and wherein a left edge and a right edge of the first and second periodic structures on the image are asymmetrical.

The flowchart and block diagrams in the figures illustrate examples of the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams or flowchart illustration, and combinations of blocks in the block diagrams or flowchart illustration, can be implemented by special purpose hardware-based systems that perform the specified functions or acts, or combinations of special purpose hardware and computer instructions.

It is understood that the described embodiments are not mutually exclusive, and elements, components, materials, or steps described in connection with one example embodiment may be combined with, or eliminated from, other embodiments in suitable ways to accomplish desired design objectives.

Reference herein to "some embodiments" or "some exemplary embodiments" mean that a particular feature, structure, or characteristic described in connection with the embodiment can be included in at least one embodiment. The appearance of the phrases "one embodiment" "some embodiments" or "some exemplary embodiments" in various places in the specification do not all necessarily refer to the same embodiment, nor are separate or alternative embodiments necessarily mutually exclusive of other embodiments.

It should be understood that the steps of the example methods set forth herein are not necessarily required to be performed in the order described, and the order of the steps of such methods should be understood to be merely example. Likewise, additional steps may be included in such methods, and certain steps may be omitted or combined, in methods consistent with various embodiments.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word is intended to present concepts in a concrete fashion.

Additionally, the articles "a" and "an" as used in this application and the appended claims should generally be construed to mean "one or more" unless specified otherwise or clear from context to be directed to a singular form.

Unless explicitly stated otherwise, each numerical value and range should be interpreted as being approximate as if the word "about" or "approximately" preceded the value of the value or range.

The use of figure numbers or figure reference labels in the claims is intended to identify one or more possible embodiments of the claimed subject matter to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

It will be further understood that various changes in the details, materials, and arrangements of the parts which have been described and illustrated in order to explain the nature of described embodiments may be made by those skilled in the art without departing from the scope as expressed in the following claims.

The invention claimed is:

1. A method for calibrating a scanning electron microscope (SEM), comprising:
   providing a reference sample including a first periodic structure interleaved with a second periodic structure, each of the first periodic structure and second periodic structure having a period along a measurement direction;
   measuring, by the SEM, an offset between the first periodic structure and the second periodic structure;
   comparing the measured offset with an induced offset; and
   calibrating the SEM based on the comparison.

2. The method of claim 1, wherein the induced offset comprises an offset predefined for the reference sample.

3. The method of claim 2, wherein the induced offset further comprises an offset caused by an overlay error during a manufacturing process of the reference sample.

4. The method of claim 1, wherein the induced offset is obtained by tracing using a laser interferometer.

5. The method of claim 1, wherein the offset measured by the SEM is based on an image of the reference sample obtained by the SEM, and wherein a left edge and a right edge of the first and second periodic structures on the image are asymmetrical.

6. The method of claim 1, wherein the first periodic structure and the second periodic structure are on different layers of the reference sample.

7. The method of claim 1, wherein each of the first periodic structure and the second periodic structure comprise a set of periodic lines.

8. The method of claim 1, further comprising:
   tracing a critical dimension of the first and second periodic structures; and
   measuring, by the SEM, the critical dimension of the first and second periodic structures,
   wherein calibrating the SEM further comprises calibrating the SEM based on a correlation between the measured critical dimension and the traced critical dimension of the first and second periodic structures.

9. The method claim 1, further comprising:
   tracing a line width of the first periodic structure or the second periodic structure; and
   measuring, by the SEM, the line width of the first periodic structure or the second periodic structure,
   wherein calibrating the SEM further comprises calibrating the SEM based on a correlation between the measured line width and the traced line width of the first periodic structure or the second periodic structure.

10. The method of claim 1, wherein:
    the first periodic structure includes a first set of lines extending in a first direction and a second set of lines that are connected with the first set of lines and extending in a second direction; and
    the second periodic structure includes a third set of lines extending in the first direction and a fourth set of lines that are connected with the third set of lines and extending in the second direction.

11. The method of claim 1, wherein:
    the first periodic structure further comprises a plurality of first periodic sub-structures disposed on different areas of the reference sample;
    the second periodic structure further comprises a plurality of second periodic sub-structures disposed on different areas of the reference sample; and
    each of the plurality of first periodic sub-structures is paired with a corresponding one of the plurality of second periodic sub-structures to form a plurality of pairs of first and second periodic sub-structures for calibration.

* * * * *